US009705203B2

(12) United States Patent
Khlat et al.

(10) Patent No.: US 9,705,203 B2
(45) Date of Patent: Jul. 11, 2017

(54) RADIO FREQUENCY FRONT END ARCHITECTURE WITH A SWITCH TOPOLOGY FOR ROUTING FILTER CIRCUITS WHILE SUBSTANTIALLY REDUCING VARIATIONS IN THE REACTIVE LOADING AT COMMON PORTS

(71) Applicant: Qorvo US, Inc., Greensboro, NC (US)

(72) Inventors: Nadim Khlat, Cugnaux (FR); Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/235,789

(22) Filed: Aug. 12, 2016

(65) Prior Publication Data

US 2017/0047666 A1 Feb. 16, 2017

Related U.S. Application Data

(60) Provisional application No. 62/203,967, filed on Aug. 12, 2015.

(51) Int. Cl.
| | |
|---|---|
| *H04B 1/44* | (2006.01) |
| *H01Q 21/00* | (2006.01) |
| *H03H 7/01* | (2006.01) |
| *H04B 1/00* | (2006.01) |

(52) U.S. Cl.
CPC ....... *H01Q 21/0006* (2013.01); *H03H 7/0115* (2013.01); *H03H 7/0138* (2013.01); *H04B 1/006* (2013.01)

(58) Field of Classification Search
None
See application file for complete search history.

(56) References Cited

U.S. PATENT DOCUMENTS

| | | | | |
|---|---|---|---|---|
| 8,068,805 | B2 * | 11/2011 | Guda | H04B 7/0413 370/334 |
| 8,320,847 | B2 * | 11/2012 | Weber | H04B 7/04 455/101 |
| 8,680,947 | B1 * | 3/2014 | Costa | H01P 1/213 333/101 |
| 9,118,100 | B2 * | 8/2015 | Khlat | H01P 1/15 |
| 9,118,376 | B2 * | 8/2015 | Khlat | H04B 1/10 |
| 9,172,422 | B2 * | 10/2015 | Desclos | H04B 1/44 |
| 9,190,699 | B2 * | 11/2015 | Granger-Jones | H01P 1/15 |

(Continued)

*Primary Examiner* — Tuan A Tran
(74) *Attorney, Agent, or Firm* — Withrow & Terranova, P.L.L.C.

(57) ABSTRACT

Radio frequency (RF) front end circuitry is disclosed that includes a filter circuit, a first switch device, and a second switch device. The filter circuit is coupled to present a filter capacitance to the first RF port and to the second RF port. The second switch device is configured to present a device capacitance to the second RF port when a common port of the second switch device is shunted to ground. The first switch device is configured to present approximately the filter capacitance and the device capacitance to its common port. The device capacitance from the second switch device can thus be used to tune a total capacitance presented to the common port of the first switch device. As such, the total capacitance presented to the common port of the first switch device can be maintained substantially unchanged without requiring a substantial increase in the number of switching components.

25 Claims, 9 Drawing Sheets

(56) References Cited

U.S. PATENT DOCUMENTS

| | | | |
|---|---|---|---|
| 9,203,596 B2* | 12/2015 | Granger-Jones | H04L 5/08 |
| 9,219,594 B2* | 12/2015 | Khlat | H04L 5/06 |
| 9,419,775 B2* | 8/2016 | Granger-Jones | H04L 5/08 |
| 2013/0335160 A1* | 12/2013 | Khlat | H01P 1/15 |
| | | | 333/103 |
| 2015/0133067 A1* | 5/2015 | Chang | H04B 1/48 |
| | | | 455/78 |
| 2015/0222026 A1* | 8/2015 | Tombak | H01Q 1/523 |
| | | | 343/876 |
| 2015/0303976 A1* | 10/2015 | Khlat | H01P 1/15 |
| | | | 455/78 |
| 2015/0326326 A1* | 11/2015 | Nobbe | H04B 17/12 |
| | | | 375/224 |
| 2016/0065167 A1* | 3/2016 | Granger-Jones | H01F 38/14 |
| | | | 333/112 |
| 2016/0119003 A1* | 4/2016 | Granger-Jones | H04B 1/006 |
| | | | 370/276 |

* cited by examiner

RADIO FREQUENCY FRONT END ARCHITECTURE WITH A SWITCH TOPOLOGY FOR ROUTING FILTER CIRCUITS WHILE SUBSTANTIALLY REDUCING VARIATIONS IN THE REACTIVE LOADING AT COMMON PORTS

RELATED APPLICATIONS

This application claims the benefit of U.S. provisional patent application No. 62/203,967, filed Aug. 12, 2015, the disclosure of which is incorporated herein by reference in its entirety.

FIELD OF THE DISCLOSURE

This disclosure relates generally to radio frequency (RF) front end circuitry used to route RF signals.

BACKGROUND

Radio frequency (RF) front end circuitry is utilized in mobile communication devices (e.g., laptops, cellular phones, tablets, etc.) to handle RF signals transmitted to the mobile communication devices and/or received by the mobile communication devices. Manufacturers and consumers of mobile communication devices continue to demand increasingly greater rates of data exchange (data rates) and the ability to handle RF signals formatted in accordance with an increasing variety of RF communication standards and RF communication specifications. As such, the RF front end circuitry may include RF transceiver circuitry with a plurality of different transmit chains and receiver chains in order to process the various types of RF signals. The RF front end circuitry may thus include RF front end circuitry, such as antenna switching circuitry, that allows for RF signals to be routed to the various transmit chains and receiver chains from one or more common antennas. Furthermore, carrier aggregation techniques are often employed where multiple RF signals are simultaneously received or transmitted from a common antenna.

Filtering circuitry is often employed in order to route the RF signals to and/or from the appropriate RF transceiver chains. Unfortunately, the various filter circuits employed in order to route the RF signals can load one another and cause significant distortion. Thus, switching circuits are often employed in order to isolate the different filter circuits from one another. However, when the different filtering circuits are switched in and out, the reactive load seen by the antenna changes. This can result in significant insertion losses.

Additionally, switching components may be added to reduce these losses; however, these switchable components can significantly add to the amount of area required to build the switching circuits. Accordingly, RF front end circuitry is needed with switch technology that can provide isolation between filter circuits that changes in the reactive load at the antenna as different filter circuits are switched in and out but does not significantly add to the area required to build the switching circuitry.

SUMMARY

Radio frequency (RF) front end circuitry is disclosed along with methods of operating the same. In one embodiment, the RF front end circuitry includes a first filter circuit, a first switch device, and a second switch device. The first switch device has a first common port, a first RF port, a first switchable series path connected in series between the first common port and the first RF port, and a first switchable shunt path connected in shunt with respect to the first common port. The second switch device comprises a second common port, a second RF port, a second switchable series path connected in series between the second common port and the second RF port, and a second switchable shunt path connected in shunt with respect to the second common port. The first RF port and the second RF port are coupled to one another.

The first filter circuit is coupled to present a first filter capacitance to the first RF port and to the second RF port. The second switch device is configured to present a first device capacitance to the second RF port when the second switchable series path is opened and the second switchable shunt path is closed. The first switch device is configured to present approximately the first filter capacitance and a first device capacitance from the first RF port to the first common port when the first switchable series path is closed and the first switchable shunt path is opened. Since the second switch device is configured to provide the first device capacitance that is presented to the first common port of the first switch device, the first device capacitance can be used to tune a total capacitance presented to the first common port. As such, the total capacitance presented to the first common port can be maintained substantially unchanged without requiring a substantial increase in the number of switching components to provide isolation to the other filter circuits connected to the second switch device.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
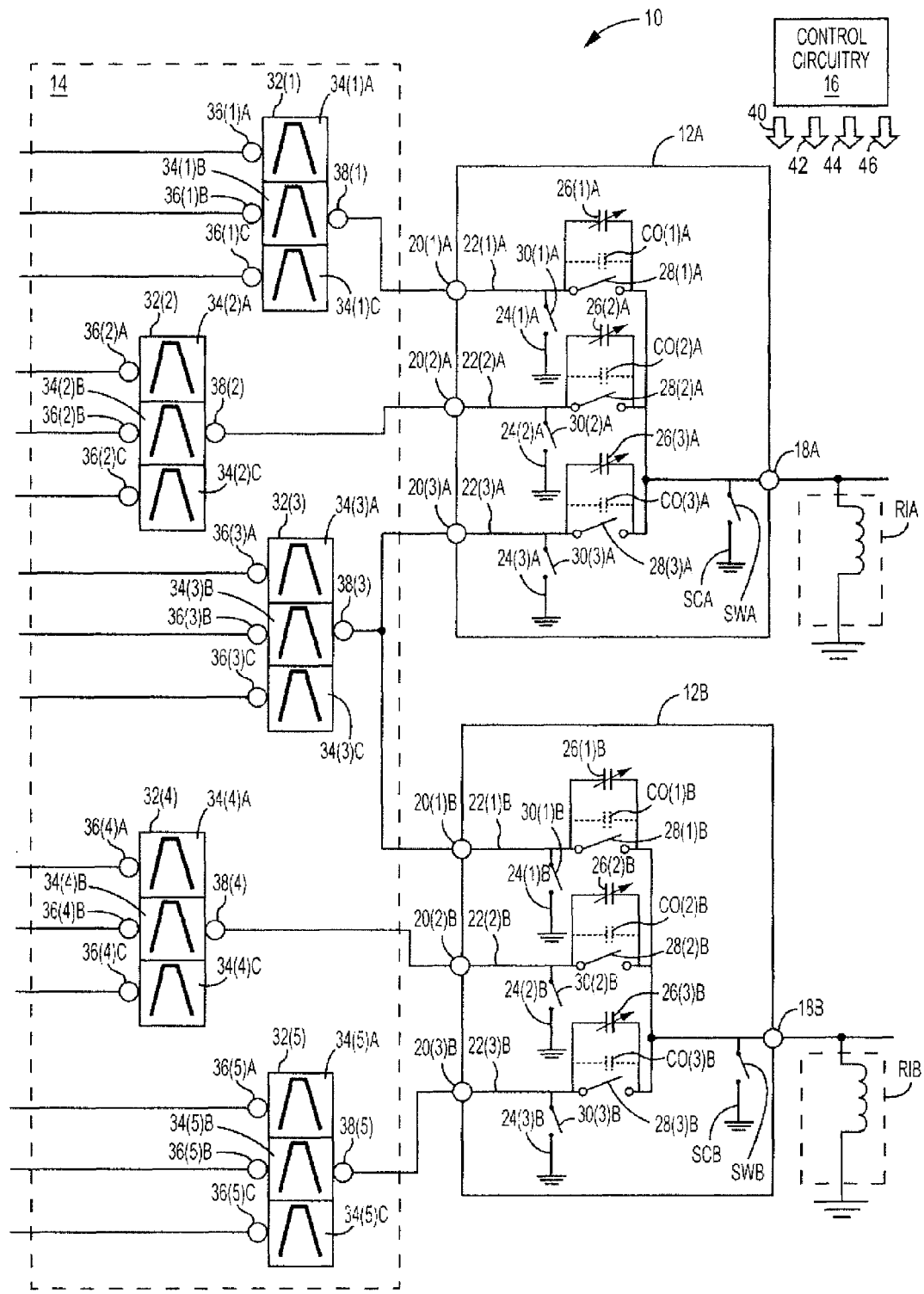
FIG. 1 illustrates one embodiment of radio frequency (RF) front end circuitry that includes a filtering circuitry, a first switch device, and a second switch device, wherein a first switchable shunt path is directly connected to a first common port of the first switch device, and a second switchable shunt path is directly connected to a second common port of the second switch device.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Throughout this disclosure, relative terminology, such as "approximately," "substantially," and the like, may be used in a predicate to describe features and relationships between features of a device or method. The relative terminology in the predicate should be interpreted sensu lato. However, whether the predicate employing the relative terminology is satisfied is determined in accordance to error ranges and/or variation tolerances relevant to the predicate and prescribed to the device or method by radio frequency (RF) communication standards relevant to the RF application(s) employing the device or method. For example, the particular RF application employing the device or method may be designed to operate in accordance with certain communication standards, specifications, or the like. These communication standards and specification may prescribe the error ranges and/or variation tolerances relevant to the predicate or may describe performance parameters relevant to the predicate from which the error ranges and/or variation tolerances for the device or method can be deduced or inferred.

With regard to the term "port," a port refers to any component or set of components configured to input and/or output RF signals. To illustrate, a port may be provided as a node, pin, terminal, contact, connection pad, and/or the like or a set of the aforementioned components. For example, with regard to a single-ended signal, a port may be provided by a single node or a single terminal. However, in other embodiments for a differential signal, a port may be provided by a pair of terminals or nodes configured to receive and/or transmit differential signals.

This disclosure describes arrangements of RF front end circuitry that may be utilized to provide carrier aggregation of RF signals to or from two or more common ports while maintaining reactive loading at the common ports substantially constant. For example, each of the common ports may be coupled to a different antenna port in a plurality of antenna ports. Thus, the RF front end circuitry may be arranged to route RF signals within different RF bands from antennas to different RF transceiver chains or from RF transceiver chains to different antennas. With regard to carrier aggregation, multiple RF signals from multiple RF transceiver chains are routed to the same antenna simultaneously. The RF front end circuitry maintains the reactive loading at the common port coupled to the antenna port associated with each antenna substantially constant, and thus a return loss at each of the antenna port can be kept substantially unchanged, thereby allowing improvements in insertion losses. Furthermore, the RF front end circuitry can maintain the reactive loading substantially constant during carrier aggregation without adding or without adding a significant number of switching components.

More specifically, the RF front end circuitry may include a first switch device having a first common port, a second switch device having a second common port, and filtering circuitry having one or more filter circuits, where at least one of the filtering circuits is tied together to both the common ports through the switch devices. For example, each of the switch devices may include multiple RF ports each connected to a different corresponding filter circuit in the filtering circuitry and may include switchable series paths each connected between the common port and a corresponding one of the RF ports. However, an RF port of the first switch device and an RF port of the second switch device are connected to the same filter circuit so that an RF signal from that filter circuit can be routed to either the first common port or the second common port. Each of the filter circuits connected to the RF ports of the first switch device may provide a filter capacitance that is presented to first common port of the switch device when the switchable series path corresponding to the filter circuit is closed. Each of the filter circuits connected to the RF ports of the second switch device may also provide a filter capacitance that is presented to second common port of the second switch device when the switchable series path corresponding to the filter circuit is closed. The RF front end circuitry is arranged so that a total capacitance at the common port is maintained approximately unchanged regardless of which filter capacitances are being presented to the common ports.

With regard to the filter circuit connected to RF ports of both the first switch device and the second switch device, each switch device is arranged to shunt its respective common port to ground and present the appropriate device capacitance to the other common port of the other switch device. In this manner, when the first common port is being utilized for carrier aggregation, the second switch device can present the appropriate capacitance to the first common port so that the total capacitance is maintained approximately unchanged when the first switch device and first common port are being used for carrier aggregation. Similarly, when the second common port is being utilized for carrier aggregation, the first switch device can present the appropriate capacitance to the second common port so that the total capacitance is maintained approximately unchanged when the second switch device and the second common port are being used for carrier aggregation. As such, a total capacitance at the first common port and a total capacitance at the second common port is maintained approximately unchanged regardless of which of the switchable series paths are opened and closed. Accordingly, by opening the switchable series paths when RF signals are not being routed through the corresponding filter circuits of the filtering circuitry, the switch device provides isolation between the different filter circuits and reduces loading. In addition, the RF front end circuitry maintains the total capacitance presented to the common ports approximately unchanged. Accordingly, the total capacitance presented at the common ports and to the antenna ports is maintained approximately unchanged regardless of the carrier aggregation combination, thereby allowing for insertion losses to be reduced while not adding significantly to the area required by the circuitry.

FIG. 1 is an illustration of one embodiment of RF front end circuitry 10 that includes a switch device 12A, a switch device 12B, filtering circuitry 14, and control circuitry 16. With regard to the switch device 12A, the switch device 12A may be any type of device having one or more switchable paths that are operable to be opened and closed. In this embodiment, the switch device 12A is a single pole triple throw switch device. As such, the switch device 12A includes a common port 18A, an RF port 20(1)A, an RF port 20(2)A and an RF port 20(3)A. (The RF port 20(1)A, the RF port 20(2)A, and the RF port 20(3)A are referred to collectively or generically as the RF port(s) 20A.) Furthermore, the switch device 12A includes a switchable series path 22(1)A, a switchable series path 22(2)A, a switchable series path 22(3)A (referred to collectively or generically as the switchable series path(s) 22A) a switchable shunt path 24(1)A, a switchable shunt path 24(2)A, a switchable shunt path 24(3)A (referred to collectively or generically as switchable shunt path(s) 24A). Additionally, the switch device 12A includes a capacitive element 26(1)A having a capacitance, a capacitive element 26(2)A having a capacitance, and a capacitive element 26(3)A having a capacitance (referred to collectively or generically as the capacitive element(s) 26A). It should be noted that in alternative embodiments, the switch device 12A may be a switch device of any number of switchable paths between any number of RF ports and common ports including having a single switchable series path connected between a single common port and a single RF port. Thus, any number of the capacitive elements 26A may be provided including a single capacitive element. The capacitive elements 26A may be provided as any suitable type of capacitive element. In one embodiment, each of the capacitive elements 26A is provided as a metal-insulator-metal (MIM) capacitor, since MIM capacitors have a high quality factor while being small in size. In another embodiment, each of the capacitive elements 26A is provided as a metal-on-metal (MOM) capacitor. In still another embodiment, the capacitive elements 26A are provided as a programmable array of capacitors (PACs).

Each of the switchable series paths 22A and each of the switchable shunt paths 24A are operable to be opened and closed. Each of the switchable shunt paths 24A is connected in series between the common port 18A and a corresponding one of the RF ports 20A, and each of the switchable shunt paths 24A is connected in shunt to a corresponding one of the switchable series paths 22A. More specifically, the switchable series path 22(1)A is connected in series between the common port 18A and the RF port 20(1)A. In this embodiment, the switchable series path 22(1)A includes a switch 28(1)A connected in series within the switchable series path 22(1)A. The switch 28(1)A is operable to be turned on so that the switchable series path 22(1)A is opened and is operable to be turned off so that the switchable series path 22(1)A is closed. The switch 28(1)A also is operable to provide an off switch capacitance CO(1)A when the switch 28(1)A is turned off but is operable so as not to provide the off switch capacitance CO(1)A when the switch 28(1)A is turned on. Also, the switchable shunt path 24(1)A includes a switch 30(1)A connected in series within the switchable shunt path 24(1)A. The switchable shunt path 24(1)A is connected in shunt to the switchable series path 22(1)A between the switch 28(1)A and the RF port 20(1)A. The switch 30(1)A is operable to be turned on so that the switchable shunt path 24(1)A is opened and is operable to be turned off so that the switchable shunt path 24(1)A is closed.

Next, the switchable series path 22(2)A is connected in series between the common port 18A and the RF port 20(2)A. In this embodiment, the switchable series path 22(2)A includes a switch 28(2)A connected in series within the switchable series path 22(2)A. The switch 28(2)A is operable to be turned on so that the switchable series path 22(2)A is opened and is operable to be turned off so that the switchable series path 22(2)A is closed. The switch 28(2)A also is operable to provide an off switch capacitance CO(2)A when the switch 28(2)A is turned off but is operable so as not to provide the off switch capacitance CO(2)A when the switch 28(2)A is turned on. Also, the switchable shunt path 24(2)A includes a switch 30(2)A connected in series within the switchable shunt path 24(2)A. The switchable shunt path 24(2)A is connected in shunt to the switchable series path 22(2)A between the switch 28(2)A and the RF port 20(2)A. The switch 30(2)A is operable to be turned on so that the switchable shunt path 24(2)A is opened and is operable to be turned off so that the switchable shunt path 24(2)A is closed.

Finally, the switchable series path 22(3)A is connected in series between the common port 18A and the RF port 20(3)A. In this embodiment, the switchable series path 22(3)A includes a switch 28(3)A connected in series within the switchable series path 22(3)A. The switch 28(3)A is operable to be turned on so that the switchable series path 22(3)A is opened and is operable to be turned off so that the switchable series path 22(3)A is closed. The switch 28(3)A also is operable to provide an off switch capacitance CO(3)A when the switch 28(3)A is turned off but is operable so as not to provide the off switch capacitance CO(3)A when the switch 28(3)A is turned on. Also, the switchable shunt path 24(3)A includes a switch 30(3)A connected in series within the switchable shunt path 24(3)A. The switchable shunt path 24(3)A is connected in shunt to the switchable series path 22(3)A between the switch 28(3)A and the RF port 20(3)A. The switch 30(3)A is operable to be turned on so that the switchable shunt path 24(3)A is opened and is operable to be turned off so that the switchable shunt path 24(3)A is closed. (The switch 28(1)A, the switch 28(2)A, and the switch 28(3)A are referred to collectively or generically as switch(es) 28A; the switch 30(1)A, the switch 30(2)A, and the switch 30(3)A are referred to generically as the switch(es) 30A; and the off switch capacitance CO(1)A, the off switch capacitance CO(2)A, and the off switch capacitance CO(3)A are referred to generically or specifically as the off switch capacitance(s) COA).

The switches 28A and the switches 30A may each be provided as any suitable type of switch. For example, the switches 28A and the switches 30A may each be provided as a field effect transistor (FET), a microelectromechanical switch (MEMS), or a pseudomorphic high electron mobility transistor (pHEMT). Substrate configurations that may be used to form the switches 28A, 30A include complementary metal oxide semiconductor (CMOS), silicon-on-insulator (SOI), and silicon-on-sapphire (SOS).

With regard to the switch device 12B, the switch device 12B may be any type of device having one or more switchable paths that are operable to be opened and closed. In this embodiment, the switch device 12B is a single pole triple throw switch device. As such, the switch device 12B includes a common port 18B, an RF port 20(1)B, an RF port 20(2)B and an RF port 20(3)B. (The RF port 20(1)B, the RF port 20(2)B, and the RF port 20(3)B are referred to collectively or generically as the RF port(s) 20B). Furthermore, the switch device 12B includes a switchable series path 22(1)B, a switchable series path 22(2)B, a switchable series path 22(3)B (referred to collectively or generically as the switchable series path(s) 22B) a switchable shunt path 24(1)B, a switchable shunt path 24(2)B, a switchable shunt path 24(3)B (referred to collectively or generically as switchable shunt path(s) 24B). Additionally, the switch device 12B includes a capacitive element 26(1)B having a capacitance, a capacitive element 26(2)B having a capacitance, and a capacitive element 26(3)B having a capacitance (referred to collectively or generically as the capacitive element(s) 26B). It should be noted that in alternative embodiments, the switch device 12B may be a switch device of any number of switchable paths between any number of RF ports and common ports including having a single switchable series path connected between a single common port and a single RF port. Thus, any number of the capacitive elements 26B may be provided including a single capacitive element. The capacitive elements 26B may be provided as any suitable type of capacitive element. In one embodiment, each of the capacitive elements 26B is provided as a MIM capacitor, since MIM capacitors have a high quality factor while being small in size. In another embodiment, each of the capacitive elements 26B is provided as a MOM capacitor. In still another embodiment, the capacitive elements 26B are provided as a PAC.

Each of the switchable series paths 22B and each of the switchable shunt paths 24B are operable to be opened and closed. Each of the switchable series paths 22B is connected in series between the common port 18B and a corresponding one of the RF ports 20B, and each of the switchable shunt paths 24B is connected in shunt to a corresponding one of the switchable series paths 22B. More specifically, the switchable series path 22(1)B is connected in series between the common port 18B and the RF port 20(1)B. In this embodiment, the switchable series path 22(1)B includes a switch 28(1)B connected in series within the switchable series path 22(1)B. The switch 28(1)B is operable to be turned on so that the switchable series path 22(1)B is opened and is operable to be turned off so that the switchable series path 22(1)B is closed. The switch 28(1)B also is operable to provide an off switch capacitance CO(1)B when the switch 28(1)B is turned off but is operable so as not to provide the off switch capacitance CO(1)B when the switch 28(1)B is turned on. Also, the switchable shunt path 24(1)B includes a switch 30(1)B connected in series within the switchable shunt path 24(1)B. The switchable shunt path 24(1)B is connected in shunt to the switchable series path 22(1)B between the switch 28(1)B and the RF port 20(1)B. The switch 30(1)B is operable to be turned on so that the switchable shunt path 24(1)B is opened and is operable to be turned off so that the switchable shunt path 24(1)B is closed.

Note that the switchable shunt path 24(1)B is optional and may not be provided in alternative embodiments since the switchable shunt path 24(3)A can be utilized as a shunt path to ground the RF port 20(1)B.

Next, the switchable series path 22(2)B is connected in series between the common port 18B and the RF port 20(2)B. In this embodiment, the switchable series path 22(2)B includes a switch 28(2)B connected in series within the switchable series path 22(2)B. The switch 28(2)B is operable to be turned on so that the switchable series path 22(2)B is opened and is operable to be turned off so that the switchable series path 22(2)B is closed. The switch 28(2)B also is operable to provide an off switch capacitance CO(2)B when the switch 28(2)B is turned off but is operable so as not to provide the off switch capacitance CO(2)B when the switch 28(2)B is turned on. Also, the switchable shunt path 24(2)B includes a switch 30(2)B connected in series within the switchable shunt path 24(2)B. The switchable shunt path 24(2)B is connected in shunt to the switchable series path 22(2)B between the switch 28(2)B and the RF port 20(2)B. The switch 30(2)B is operable to be turned on so that the switchable shunt path 24(2)B is opened and is operable to be turned off so that the switchable shunt path 24(2)B is closed.

Finally, the switchable series path 22(3)B is connected in series between the common port 18B and the RF port 20(3)B. In this embodiment, the switchable series path 22(3)B includes a switch 28(3)B connected in series within the switchable series path 22(3)B. The switch 28(3)B is operable to be turned on so that the switchable series path 22(3)B is opened and is operable to be turned off so that the switchable series path 22(3)B is closed. The switch 28(3)B also is operable to provide an off switch capacitance CO(3)B when the switch 28(3)B is turned off but is operable so as not to provide the off switch capacitance CO(3)B when the switch 28(3)B is turned on. Also, the switchable shunt path 24(3)B includes a switch 30(3)B connected in series within the switchable shunt path 24(3)B. The switchable shunt path 24(3)B is connected in shunt to the switchable series path 22(3)B between the switch 28(3)B and the RF port 20(3)B. The switch 30(3)B is operable to be turned on so that the switchable shunt path 24(3)B is opened and is operable to be turned off so that the switchable shunt path 24(3)B is closed. (The switch 28(1)B, the switch 28(2)B, and the switch 28(3)B are referred to collectively or generically as switch(es) 28B; the switch 30(1)B, the switch 30(2)B, and the switch 30(3)B are referred to generically as the switch(es) 30B; and the off switch capacitance CO(1)B, the off switch capacitance CO(2)B, and the off switch capacitance CO(3)B are referred to generically or specifically as the off switch capacitance(s) COB).

The switches 28B and the switches 30B may each be provided as any suitable type of switch. For example, the switches 28B and the switches 30B may each be provided as a FET, a MEMS, or pHEMT. Substrate configurations that may be used to form the switches 28B, 30B include CMOS, SOI, and SOS.

As shown in FIG. 1, the switch device 12A also includes a switchable shunt path SCA connected in shunt with respect to the common port 18A shown in FIG. 1, and the switch device 12B includes a switchable shunt path SCB connected in shunt with respect to the common port 18B. The switchable shunt path SCA is configured to be opened and closed. More specifically, the switchable shunt path SCA includes a switch SWA connected in series within the switchable shunt path SCA. The switch SWA is operable to be turned on so that the switchable shunt path SCA is opened and is operable to be turned off so that the switchable shunt path SCA is closed. In this embodiment, the switchable shunt path SCA is directly connected to the common port 18A.

With regard to the switchable shunt path SCB of the switch device 12B, the switchable shunt path SCB is configured to be opened and closed. More specifically, the switchable shunt path SCB includes a switch SWB connected in series within the switchable shunt path SCB. The switch SWB is operable to be turned on so that the switchable shunt path SCB is opened and is operable to be turned off so that the switchable shunt path SCB is closed. In this embodiment, the switchable shunt path SCB is directly connected to the common port 18B.

The switches SWA and the switches SWB may each be provided as any suitable type of switch. For example, the switches SWA and the switches SWB may each be provided as a FET, a MEMS, or pHEMT. Substrate configurations that may be used to form the switches SWA, SWB include CMOS, SOI, and SOS.

With regard to the filtering circuitry 14, the filtering circuitry 14 includes a filter circuit 32(1), a filter circuit 32(2), a filter circuit 32(3), a filter circuit 32(4), and a filter circuit 32(5) (referred to generically or specifically as the filter circuit(s) 32). The filtering circuitry 14 shown in FIG. 1 thus has more than one of the filter circuits 32 where the filter circuits 32 are provided so that each provides a different RF passband, and thus each of the filter circuits 32 is configured to pass RF signals within different RF bands. Accordingly, the filtering circuitry 14 provides a multiplexing function through filtering. It should be noted that while the filtering circuitry 14 shown in FIG. 1 has five of the filter circuits 32 where the filter circuit 32(1), the filter circuit 32(2), the filter circuit 32(3) are operably associated with the switch device 12A and the filter circuit 32(3), the filter circuit 32(4), the filter circuit 32(5) are operably associated with the switch device 12B.

Thus, the filtering circuitry 14 provides a triplexing type functionality to both the common port 18A and the common port 18B. However, other embodiments of the filtering circuitry 14 may have any number of one or more of the filter circuits 32; and thus alternative embodiments of the filtering circuitry 14 can provide diplexing, quadriplexing, quintplexing, hexplexing, septiplexing, or octoplexing arrangements to both the common port 18A and the common port 18B. Note that the filter circuit 32(3) shown in FIG. 1 is operably associated with both the switch device 12A and the switch device 12B. As explained in further detail below, this is because the filter circuit 32(3) is utilized to provide carrier aggregation.

Referring again to the embodiment illustrated in FIG. 1, the filter circuits 32(1), 32(2), 32(3) of the filtering circuitry 14 are tied together to the common port 18A of the switch device 12A through a corresponding one of the switchable series paths 22A. Thus, the switch device 12A is configured to switch the filter circuits 32(1), 32(2), 32(3) in or out depending on the RF bands of the RF signals that are being routed through the RF front end circuitry 10. Thus, the switch device 12A can isolate the filter circuits 32(1), 32(2), 32(3) from one another by opening the switchable series paths 22A corresponding to the filter circuits 32(1), 32(2), 32(3) that are not being utilized to pass RF signals. The switch device 12A thus can reduce insertion losses and increase isolation between the filter circuits 32(1), 32(2), 32(3) of the filtering circuitry 14. As explained in further detail below, the filtering circuitry 14 and the switch device 12A are operably associated so that the reactive loading at the common port 18A is maintained approximately unchanged regardless of which of the filter circuits 32(1), 32(2), 32(3) are switched in or out by the switch device 12A.

Also, the filter circuits 32(3), 32(4), 32(5) of the filtering circuitry 14 are tied together to the common port 18B of the switch device 12B through a corresponding one of the switchable series paths 22B. Thus, the switch device 12B is configured to switch the filter circuits 32(3), 32(4), 32(5) in or out depending on the RF bands of the RF signals that are being routed through the RF front end circuitry 10. Thus, the switch device 12B can isolate the filter circuits 32(3), 32(4), 32(5) from one another by opening the switchable series paths 22B corresponding to the filter circuits 32(3), 32(4), 32(5) that are not being utilized to pass RF signals. The switch device 12B thus can reduce insertion losses and increase isolation between the filter circuits 32(3), 32(4), 32(5) of the filtering circuitry 14. As explained in further detail below, the filtering circuitry 14 and the switch device 12B are operably associated so that the reactive loading at the common port 18B is maintained approximately unchanged regardless of which of the filter circuits 32(3), 32(4), 32(5) are switched in or out by the switch device 12B.

The RF front end circuitry 10 shown in FIG. 1 further includes an inductor RIA. The inductor RIA is coupled to the common port 18A of the switch device 12A. In this embodiment, the inductor RIA is connected in shunt with respect to the common port 18A. When the switchable shunt path SCA is open, the switch device 12A is configured to present the total capacitance at the common port 18A. The inductor RIA thus resonates with the total capacitance presented at the common port 18A of the switch device 12A. The total capacitance presented at the common port 18A is maintained substantially unchanged when the switchable shunt path SCA is opened. In this manner, the inductor RIA is built to have an inductance so as to resonate out the total capacitance presented at the common port 18A. As such, the impedance of the resonator formed by the inductor RIA and the total capacitance at the common port 18A may be provided as 50 Ohms. However, when the switchable shunt path SCA is open, the common port 18A is shorted to ground. As such, the inductor RIA is also shorted to ground and thus isolated from the filtering circuitry 14.

The RF front end circuitry 10 shown in FIG. 1 further includes an inductor RIB. The inductor RIB is coupled to the common port 18B of the switch device 12B. In this embodiment, the inductor RIB is connected in shunt with respect to the common port 18B. When the switchable shunt path SCB is open, the switch device 12B is configured to present the total capacitance at the common port 18B. The inductor RIB thus resonates with the total capacitance presented at the common port 18B of the switch device 12B. The total capacitance presented at the common port 18B is maintained substantially unchanged when the switchable shunt path SCB is opened. In this manner, the inductor RIB is built to have an inductance so as to resonate out the total capacitance presented at the common port 18B. As such, the impedance of the resonator formed by the inductor RIB and the total capacitance at the common port 18B may be provided as 50 Ohms. However, when the switchable shunt path SCB is open, the common port 18B is shorted to ground. As such, the inductor RIB is also shorted to ground and thus isolated from the filtering circuitry 14.

With regard to the filter circuit 32(1) of the filtering circuitry 14, the filter circuit 32(1) is a multiplexer that includes a plurality of filters 34(1)A, 34(1)B, 34(1)C (referred to collectively or generically as filter(s) 34(1)), RF ports 36(1)A, 36(1)B, 36(1)C (referred to collectively or generically as RF port(s) 36(1)) and a common port 38(1).

In this specific embodiment, the filter circuit 32(1) is a triplexer and thus includes three filters, mainly the filter 34(1)A, the filter 34(1)B, and the filter 34(1)C and three RF ports 36(1)A, 36(1)B, 36(1)C. However, it should be noted that in alternative embodiments, the filter circuit 32(1) may include any number of one or more filters and RF ports. Each of the RF ports 36(1) is connected to a different corresponding one of the plurality of filters 34(1), and each of the plurality of filters 34(1) is connected to the common port 38(1). As such, the filter 34(1)A is connected between the common port 38(1) and the RF port 36(1)A. The filter 34(1)A is configured to provide an RF passband so that RF signals within the RF passband are passed through the filter 34(1)A to and/or from the common port 38(1) from and/or to the RF port 36(1)A. The filter 34(1)B is connected between the common port 38(1) and the RF port 36(1)B. The filter 34(1)B is configured to provide an RF passband so that RF signals within the RF passband are passed through the filter 34(1)B to and/or from the common port 38(1) from and/or to the RF port 36(1)B. The filter 34(1)C is connected between the common port 38(1) and the RF port 36(1)C. The filter 34(1)C is configured to provide an RF passband so that RF signals within the RF passband are passed through the filter 34(1)C to and/or from the common port 38(1) from and/or to the RF port 36(1)C.

The filter circuit 32(1), which in this example is a multiplexer, is configured to present a filter capacitance at the common port 38(1). Since the filter circuit 32(1) is a multiplexer (more specifically in this example a triplexer), the filter capacitance is provided as a network capacitance at the common port 38(1) of the combination of the plurality of filters 34(1) of the filter circuit 32(1). The common port 38(1) of the filter circuit 32(1) is coupled to the RF port 20(1)A of the switch device 12A. In this manner, the filter circuit 32(1) is configured to present the filter capacitance of the filter circuit 32(1) to the RF port 20(1)A of the switch device 12A.

The switch device 12A is configured to present approximately the filter capacitance of the filter circuit 32(1) at the common port 18A of the switch device 12A when the switchable series path 22(1)A is closed, when the switchable shunt path 24(1)A is open, and when the switchable shunt path SCA is open. However, the switch device 12A is configured to present approximately a device capacitance at the common port 18A when the switchable shunt path 24(1)A is closed, when the switchable series path 22(1)A is open, and when the switchable shunt path SCA is open. Accordingly, when the switchable shunt path 24(1)A is closed, the switchable series path 22(1)A is open, and the switchable shunt path SCA is open, the device capacitance (presented by the switch device 12A at the common port 18A of the switch device 12A) is set to approximately equal a combination of the capacitance provided by the capacitive element 26(1)A and the off switch capacitance CO(1)A of the switch 28(1). As shown in FIG. 1, the capacitive element 26(1)A is connected in parallel with the switch 28(1). Since the switchable shunt path 24(1)A is closed, the device capacitance is provided as a parallel equivalent capacitance of the off switch capacitance CO(1)A and the capacitance of the capacitive element 26(1)A. The device capacitance of the switch device 12A is set to approximately equal the filter capacitance of the filter circuit 32(1). In this manner, regardless of whether the switchable series path 22(1)A is opened and the switchable shunt path 24(1)A is closed or the switchable series path 22(1)A is closed and the switchable shunt path 24(1)A is opened, a capacitance presented at the common port 18A of the switch device 12A from the switchable series path 22(1)A is maintained approximately the same so long as the switchable shunt path SCA is open.

However, the switch device 12A is configured to isolate both the filter circuit 32(1), the switchable series path 22(1)A, and the capacitive element 26(1) when the switchable shunt path 24(1)A is closed and the switchable shunt path SCA is closed, regardless of whether the switchable series path 22(1)A is opened or closed. Accordingly, when the switchable shunt path 24(1)A is closed and the switchable shunt path SCA is closed, the switch device 12A is configured to not present the device capacitance (provided by the off switch capacitance CO(1)A and the capacitance of the capacitive element 26(1)A) and not present the filter capacitance of the filter circuit 32(1) to the common port 18A. In this manner, the RF port 20(2)A and the RF port 20(3)A are not loaded by either the device capacitance (provided by the off switch capacitance CO(1)A and the capacitance of the capacitive element 26(1)A) or the filter capacitance of the filter circuit 32(1).

With regard to the filter circuit 32(2) of the filtering circuitry 14, the filter circuit 32(2) is a multiplexer that includes a plurality of filters 34(2)A, 34(2)B, 34(2)C (referred to collectively or generically as filter(s) 34(2)), RF ports 36(2)A, 36(2)B, 36(2)C (referred to collectively or generically as RF port(s) 36(2)) and a common port 38(2). In this specific embodiment, the filter circuit 32(2) is a triplexer and thus includes three filters, mainly the filter 34(2)A, the filter 34(2)B, and the filter 34(2)C and three RF ports 36(2)A, 36(2)B, 36(2)C. However, it should be noted that in alternative embodiments, the filter circuit 32(2) may include any number of one or more filters and RF ports. Each of the RF ports 36(2) is connected to a different corresponding one of the plurality of filters 34(2), and each of the plurality of filters 34(2) is connected to the common port 38(2). As such, the filter 34(2)A is connected between the common port 38(2) and the RF port 36(2)A. The filter 34(2)A is configured to provide an RF passband so that RF signals within the RF passband are passed through the filter 34(2)A to and/or from the common port 38(2) from and/or to the RF port 36(2)A. The filter 34(2)B is connected between the common port 38(2) and the RF port 36(2)B. The filter 34(2)B is configured to provide an RF passband so that RF signals within the RF passband are passed through the filter 34(2)B to and/or from the common port 38(2) from and/or to the RF port 36(2)B. The filter 34(2)C is connected between the common port 38(2) and the RF port 36(2)C. The filter 34(2)C is configured to provide an RF passband so that RF signals within the RF passband are passed through the filter 34(2)C to and/or from the common port 38(2) from and/or to the RF port 36(2)C.

The filter circuit 32(2), which in this example is a multiplexer, is configured to present a filter capacitance at the common port 38(2) when the switchable series path 22(2)A is closed, when the switchable shunt path 24(2)A is open, and when the switchable shunt path SCA is open. Since the filter circuit 32(2) is a multiplexer (more specifically in this example a triplexer), the filter capacitance is provided as a network capacitance at the common port 38(2) of the combination of the plurality of filters 34(2) of the filter circuit 32(2). The common port 38(2) of the filter circuit 32(2) is coupled to the RF port 20(2)A of the switch device 12A. In this manner, the filter circuit 32(2) is configured to present the filter capacitance of the filter circuit 32(2) to the RF port 20(2)A of the switch device 12A.

The switch device 12A is configured to present approximately the filter capacitance of the filter circuit 32(2) at the common port 18A of the switch device 12A when the switchable series path 22(2)A is closed, when the switchable shunt path 24(2)A is open, and when the switchable shunt path SCA is open. However, the switch device 12A is configured to present approximately a device capacitance at the common port 18A when the switchable shunt path 24(2)A is closed, when the switchable series path 22(2)A is open, and when the switchable shunt path SCA is open. Accordingly, when the switchable shunt path 24(2)A is closed, the switchable series path 22(2)A is open, and the switchable shunt path SCA is open, the device capacitance (presented by the switch device 12A at the common port 18A of the switch device 12A) is set to approximately equal a combination of the capacitance provided by the capacitive element 26(2)A and the off switch capacitance CO(2)A of the switch 28(2). As shown in FIG. 1, the capacitive element 26(2)A is connected in parallel with the switch 28(2). Since the switchable shunt path 24(2)A is closed, the device capacitance is provided as a parallel equivalent capacitance of the off switch capacitance CO(2)A and the capacitance of the capacitive element 26(2)A. The device capacitance of the switch device 12A is set to approximately equal the filter capacitance of the filter circuit 32(2). In this manner, regardless of whether the switchable series path 22(2)A is opened and the switchable shunt path 24(2)A is closed or the switchable series path 22(2)A is closed and the switchable shunt path 24(2)A is opened, a capacitance presented at the common port 18A of the switch device 12A from the switchable series path 22(2)A is maintained approximately the same so long as the switchable shunt path SCA is open.

However, the switch device 12A is configured to isolate both the filter circuit 32(2), the switchable series path 22(2)A, and the capacitive element 26(2) when the switchable shunt path 24(2)A is closed and the switchable shunt path SCA is closed, regardless of whether the switchable series path 22(2)A is opened or closed. Accordingly, when the switchable shunt path 24(2)A is closed and the switchable shunt path SCA is closed, the switch device 12A is configured to not present the device capacitance (provided by the off switch capacitance CO(2)A and the capacitance of the capacitive element 26(2)A) and not present the filter capacitance of the filter circuit 32(2) to the common port 18A. In this manner, the RF port 20(1)A and the RF port 20(3)A are not loaded by either the device capacitance (provided by the off switch capacitance CO(2)A and the capacitance of the capacitive element 26(2)A) or the filter capacitance of the filter circuit 32(2).

With regard to the filter circuit 32(3) of the filtering circuitry 14, the filter circuit 32(3) is a multiplexer that includes a plurality of filters 34(3)A, 34(3)B, 34(3)C (referred to collectively or generically as filter(s) 34(3)), RF ports 36(3)A, 36(3)B, 36(3)C (referred to collectively or generically as RF port(s) 36(3)) and a common port 38(3)). In this specific embodiment, the filter circuit 32(3) is a triplexer and thus includes three filters, mainly the filter 34(3)A, the filter 34(3)B, and the filter 34(3)C and three RF ports 36(3)A, 36(3)B, 36(3)C. However, it should be noted that in alternative embodiments, the filter circuit 32(3) may include any number of one or more filters and RF ports. Each of the RF ports 36(3) is connected to a different corresponding one of the plurality of filters 34(3), and each of the plurality of filters 34(3) is connected to the common port 38(3). As such, the filter 34(3)A is connected between the common port 38(3) and the RF port 36(3)A. The filter 34(3)A is configured to provide an RF passband so that RF signals within the RF passband are passed through the filter 34(3)A to and/or from the common port 38(3) from and/or to the RF port 36(3)A. The filter 34(3)B is connected between the common port 38(3) and the RF port 36(3)B. The filter 34(3)B is configured to provide an RF passband so that RF signals within the RF passband are passed through the filter 34(3)B to and/or from the common port 38(3) from and/or to the RF port 36(3)B. The filter 34(3)C is connected between the common port 38(3) and the RF port 36(3)C. The filter 34(3)C is configured to provide an RF passband so that RF signals within the RF passband are passed through the filter 34(3)C to and/or from the common port 38(3) from and/or to the RF port 36(3)C.

The filter circuit 32(3), which in this example is a multiplexer, is configured to present a filter capacitance at the common port 38(3). Since the filter circuit 32(3) is a multiplexer (more specifically in this example a triplexer), the filter capacitance is provided as a network capacitance at the common port 38(3) of the combination of the plurality of filters 34(3) of the filter circuit 32(3). The common port 38(3) of the filter circuit 32(3) is coupled to the RF port 20(3)A of the switch device 12A and to the RF port 20(1)B of the switch device 12B. In this manner, the filter circuit 32(3) is configured to present the filter capacitance of the filter circuit 32(3) to the RF port 20(3)A of the switch device 12A and present the filter capacitance of the filter circuit 32(3) to the RF port 20(1)B of the switch device 12B.

The switch device 12A is configured to present approximately the filter capacitance of the filter circuit 32(3) from the RF port 20(3)A to the common port 18A of the switch device 12A when the switchable series path 22(3)A is closed, when the switchable shunt path 24(3)A is open, and when the switchable shunt path SCA is open. However, the switch device 12A is configured to present approximately a device capacitance to the common port 18A when the switchable series path 22(3)A is open, when the switchable shunt path 24(3)A is closed, and when the switchable shunt path SCA is open. Accordingly, when the switchable series path 22(3)A is open, when the switchable shunt path 24(3)A is closed, and when the switchable shunt path SCA is open, the device capacitance (presented by the switch device 12A at the common port 18A of the switch device 12A) is set to approximately equal a combination of the capacitance provided by the capacitive element 26(3)A and the off switch capacitance CO(3)A of the switch 28(3)A. As shown in FIG. 1, the capacitive element 26(3)A is connected in parallel with the switch 28(3)A. Since the switchable shunt path 24(3)A is closed, the device capacitance is provided as a parallel equivalent capacitance of the off switch capacitance CO(3)A and the capacitance of the capacitive element 26(3)A. The device capacitance of the switch device 12A is set to approximately equal the filter capacitance of the filter circuit 32(3). In this manner, regardless of whether the switchable series path 22(3)A is opened or closed, a capacitance presented at the common port 18A of the switch device 12A from the switchable series path 22(3)A is maintained approximately the same so long as the switchable shunt path SCA is open.

Furthermore, the switch device 12A is configured to isolate both the filter circuit 32(3), the switchable series path 22(3)A, and the capacitive element 26(3)A when the switchable shunt path 24(3)A is closed and the switchable shunt path SCA is closed, regardless of whether the switchable series path 22(3)A is opened or closed. Accordingly, when the switchable shunt path 24(3)A is closed and the switchable shunt path SCA is closed, the switch device 12A is configured to not present the device capacitance (provided by the off switch capacitance CO(3)A and the capacitance of the capacitive element 26(3)A) and not present the filter capacitance of the filter circuit 32(3) to the common port 18A. In this manner, the RF port 20(1)A and the RF port 20(2)A are not loaded by either the device capacitance (provided by the off switch capacitance CO(3)A and the capacitance of the capacitive element 26(3)A) or the filter capacitance of the filter circuit 32(3).

However, the switch device 12A is configured to present the device capacitance (provided by the off switch capacitance CO(3)A and the capacitance of the capacitive element 26(3)A) to the RF port 20(3)A when the switchable series path 22(3)A is open, the switchable shunt path 24(3)A is open, and the switchable shunt path SCA is closed. In this manner, the device capacitance (provided by the off switch capacitance CO(3)A and the capacitance of the capacitive element 26(3)A) from the RF port 20(3)A is presented to the RF port 20(1)B of the switch device 12B. The switch device 12B is thus configured to present approximately the filter capacitance of the filter circuit 32(3) from the RF port 20(1)B and the device capacitance from the RF port 20(3)B of switch device 12B to the common port 18B when the switchable series path 22(1)B is closed, the switchable shunt path 24(1)B is open, and the switchable shunt path SCB is open. The device capacitance provided by the off switch capacitance CO(3)B and the capacitance of the capacitive element 26(3)B are set to approximately equal the filter capacitance of the filter circuit 32(1) for the reasons explained below.

The switch device 12B is configured to present approximately the filter capacitance of the filter circuit 32(3) from the RF port 20(1)B to the common port 18B of the switch device 12B when the switchable series path 22(1)B is closed, when the switchable shunt path 24(1)B is open, and when the switchable shunt path SCB is open. However, the switch device 12B is configured to present approximately a device capacitance to the common port 18B when the switchable series path 22(1)B is open, when the switchable shunt path 24(1)B is closed, and when the switchable shunt path SCB is open. Accordingly, when the switchable series path 22(1)B is open, when the switchable shunt path 24(1)B is closed, and when the switchable shunt path SCB is open, the device capacitance (presented by the switch device 12B at the common port 18B of the switch device 12B) is set to approximately equal a combination of the capacitance provided by the capacitive element 26(1)B and the off switch capacitance CO(1)B of the switch 28(1)B. As shown in FIG. 1, the capacitive element 26(1)B is connected in parallel with the switch 28(1)B. Since the switchable shunt path 24(1)B is closed, the device capacitance is provided as a parallel equivalent capacitance of the off switch capacitance CO(1)B and the capacitance of the capacitive element 26(1)B. The device capacitance of the switch device 12B is set to approximately equal the filter capacitance of the filter circuit 32(3). In this manner, regardless of whether the switchable series path 22(1)B is opened or closed, a capacitance presented at the common port 18B of the switch device 12B from the switchable series path 22(1)B is maintained approximately the same so long as the switchable shunt path SCB is open.

Furthermore, the switch device 12B is configured to isolate both the filter circuit 32(3), the switchable series path 22(1)B, and the capacitive element 26(1)B when the switchable shunt path 24(1)B is closed and the switchable shunt path SCB is closed, regardless of whether the switchable series path 22(1)B is opened or closed. Accordingly, when the switchable shunt path 24(1)B is closed and the switchable shunt path SCB is closed, the switch device 12B is configured to not present the device capacitance (provided by the off switch capacitance CO(1)B and the capacitance of the capacitive element 26(1)B) and not present the filter capacitance of the filter circuit 32(3) to the common port 18B. In this manner, the RF port 20(2)B and the RF port 20(3)B are not loaded by either the device capacitance (provided by the off switch capacitance CO(1)B and the capacitance of the capacitive element 26(1)B) or the filter capacitance of the filter circuit 32(3).

However, the switch device 12B is configured to present the device capacitance (provided by the off switch capacitance CO(1)B and the capacitance of the capacitive element 26(1)B) to the RF port 20(1)B when the switchable series path 22(1)B is open, the switchable shunt path 24(1)B is open, and the switchable shunt path SCB is closed. In this manner, the device capacitance (provided by the off switch capacitance CO(1)B and the capacitance of the capacitive element 26(1)B) from the RF port 20(1)B is presented to the RF port 20(3)A of the switch device 12A. The switch device 12A is thus configured to present approximately the filter capacitance of the filter circuit 32(3) from the RF port 20(3)A and the device capacitance from the RF port 20(1)B of switch device 12B to the common port 18A when the switchable series path 22(3)A is closed, the switchable shunt path 24(3)A is open, and the switchable shunt path SCA is open.

With regard to the filter circuit 32(4) of the filtering circuitry 14, the filter circuit 32(4) is a multiplexer that includes a plurality of filters 34(4)A, 34(4)B, 34(4)C (referred to collectively or generically as filter(s) 34(4)), RF ports 36(4)A, 36(4)B, 36(4)C (referred to collectively or generically as RF port(s) 36(4)) and a common port 38(4)). In this specific embodiment, the filter circuit 32(4) is a triplexer and thus includes three filters, mainly the filter 34(4)A, the filter 34(4)B, and the filter 34(4)C and three RF ports 36(4)A, 36(4)B, 36(4)C. However, it should be noted that in alternative embodiments, the filter circuit 32(4) may include any number of one or more filters and RF ports. Each of the RF ports 36(4) is connected to a different corresponding one of the plurality of filters 34(4), and each of the plurality of filters 34(4) is connected to the common port 38(4). As such, the filter 34(4)A is connected between the common port 38(4) and the RF port 36(4)A. The filter 34(4)A is configured to provide an RF passband so that RF signals within the RF passband are passed through the filter 34(4)A to and/or from the common port 38(4) from and/or to the RF port 36(4)A. The filter 34(4)B is connected between the common port 38(4) and the RF port 36(4)B. The filter 34(4)B is configured to provide an RF passband so that RF signals within the RF passband are passed through the filter 34(4)B to and/or from the common port 38(4) from and/or to the RF port 36(4)B. The filter 34(4)C is connected between the common port 38(4) and the RF port 36(4)C. The filter 34(4)C is configured to provide an RF passband so that RF signals within the RF passband are passed through the filter 34(4)C to and/or from the common port 38(4) from and/or to the RF port 36(4)C.

The filter circuit 32(4), which in this example is a multiplexer, is configured to present a filter capacitance at the common port 38(4) when the switchable series path 22(2)B is closed, when the switchable shunt path 24(2)B is open, and when the switchable shunt path SCB is open. Since the filter circuit 32(4) is a multiplexer (more specifically in this example a triplexer), the filter capacitance is provided as a network capacitance at the common port 38(2) of the combination of the plurality of filters 34(4) of the filter circuit 32(4). The common port 38(4) of the filter circuit 32(4) is coupled to the RF port 20(2)B of the switch device 12B. In this manner, the filter circuit 32(4) is configured to present the filter capacitance of the filter circuit 32(4) to the RF port 20(2)B of the switch device 12B.

The switch device 12B is configured to present approximately the filter capacitance of the filter circuit 32(4) at the common port 18B of the switch device 12B when the switchable series path 22(2)B is closed, when the switchable shunt path 24(2)B is open, and when the switchable shunt path SCB is open. However, the switch device 12B is configured to present approximately a device capacitance at the common port 18B when the switchable shunt path 24(2)B is closed, when the switchable series path 22(2)B is open, and when the switchable shunt path SCA is open. Accordingly, when the switchable shunt path 24(2)B is closed, the switchable series path 22(2)B is open, and the switchable shunt path SCA is open, the device capacitance (presented by the switch device 12B at the common port 18B of the switch device 12B) is set to approximately equal a combination of the capacitance provided by the capacitive element 26(2)B and the off switch capacitance CO(2)B of the switch 28(2)B. As shown in FIG. 1, the capacitive element 26(2)B is connected in parallel with the switch 28(2). Since the switchable shunt path 24(2)B is closed, the device capacitance is provided as a parallel equivalent capacitance of the off switch capacitance CO(2)B and the capacitance of the capacitive element 26(2)B. The device capacitance of the switch device 12B is set to approximately equal the filter capacitance of the filter circuit 32(4). In this manner, regardless of whether the switchable series path 22(2)B is opened and the switchable shunt path 24(2)B is closed or the switchable series path 22(2)B is closed and the switchable shunt path 24(2)B is opened, a capacitance presented at the common port 18B of the switch device 12B from the switchable series path 22(2)B is maintained approximately the same so long as the switchable shunt path SCB is open.

However, the switch device 12B is configured to isolate both the filter circuit 32(4), the switchable series path 22(2)B, and the capacitive element 26(2) when the switchable shunt path 24(2)B is closed and the switchable shunt path SCB is closed, regardless of whether the switchable series path 22(2)B is opened or closed. Accordingly, when the switchable shunt path 24(2)B is closed and the switchable shunt path SCB is closed, the switch device 12B is configured to not present the device capacitance (provided by the off switch capacitance CO(2)B and the capacitance of the capacitive element 26(2)B) and not present the filter capacitance of the filter circuit 32(4) to the common port 18B. In this manner, the RF port 20(1)B and the RF port 20(3)B are not loaded by either the device capacitance (provided by the off switch capacitance CO(2)B and the capacitance of the capacitive element 26(2)B) or the filter capacitance of the filter circuit 32(4).

With regard to the filter circuit 32(5) of the filtering circuitry 14, the filter circuit 32(5) is a multiplexer that includes a plurality of filters 34(5)A, 34(5)B, 34(5)C (referred to collectively or generically as filter(s) 34(5)), RF ports 36(5)A, 36(5)B, 36(5)C (referred to collectively or generically as RF port(s) 36(5)) and a common port 38(5)). In this specific embodiment, the filter circuit 32(5) is a triplexer and thus includes three filters, mainly the filter 34(5)A, the filter 34(5)B, and the filter 34(5)C and three RF ports 36(5)A, 36(5)B, 36(5)C. However, it should be noted that in alternative embodiments, the filter circuit 32(5) may include any number of one or more filters and RF ports. Each of the RF ports 36(5) is connected to a different corresponding one of the plurality of filters 34(5), and each of the plurality of filters 34(5) is connected to the common port 38(5). As such, the filter 34(5)A is connected between the common port 38(5) and the RF port 36(5)A. The filter 34(5)A is configured to provide an RF passband so that RF signals within the RF passband are passed through the filter 34(5)A to and/or from the common port 38(5) from and/or to the RF port 36(5)A. The filter 34(5)B is connected between the common port 38(5) and the RF port 36(5)B. The filter 34(5)B is configured to provide an RF passband so that RF signals within the RF passband are passed through the filter 34(5)B to and/or from the common port 38(5) from and/or to the RF port 36(5)B. The filter 34(5)C is connected between the common port 38(5) and the RF port 36(5)C. The filter 34(5)C is configured to provide an RF passband so that RF signals within the RF passband are passed through the filter 34(5)C to and/or from the common port 38(5) from and/or to the RF port 36(5)C.

The filter circuit 32(5), which in this example is a multiplexer, is configured to present a filter capacitance at the common port 38(5) when the switchable series path 22(3)B is closed, when the switchable shunt path 24(3)B is open, and when the switchable shunt path SCB is open. Since the filter circuit 32(5) is a multiplexer (more specifically in this example a triplexer), the filter capacitance is provided as a network capacitance at the common port 38(2) of the combination of the plurality of filters 34(5) of the filter circuit 32(5). The common port 38(5) of the filter circuit 32(5) is coupled to the RF port 20(3)B of the switch device 12B. In this manner, the filter circuit 32(5) is configured to present the filter capacitance of the filter circuit 32(5) to the RF port 20(3)B of the switch device 12B.

The switch device 12B is configured to present approximately the filter capacitance of the filter circuit 32(5) at the common port 18B of the switch device 12B when the switchable series path 22(3)B is closed, when the switchable shunt path 24(3)B is open, and when the switchable shunt path SCB is open. However, the switch device 12B is configured to present approximately a device capacitance at the common port 18B when the switchable shunt path 24(3)B is closed, when the switchable series path 22(3)B is open, and when the switchable shunt path SCA is open. Accordingly, when the switchable shunt path 24(3)B is closed, the switchable series path 22(3)B is open, and the switchable shunt path SCA is open, the device capacitance (presented by the switch device 12B at the common port 18B of the switch device 12B) is set to approximately equal a combination of the capacitance provided by the capacitive element 26(3)B and the off switch capacitance CO(3)B of the switch 28(3)B. As shown in FIG. 1, the capacitive element 26(3)B is connected in parallel with the switch 28(2). Since the switchable shunt path 24(3)B is closed, the device capacitance is provided as a parallel equivalent capacitance of the off switch capacitance CO(3)B and the capacitance of the capacitive element 26(3)B. The device capacitance of the switch device 12B is set to approximately equal the filter capacitance of the filter circuit 32(5). In this manner, regardless of whether the switchable series path 22(3)B is opened and the switchable shunt path 24(3)B is closed or the switchable series path 22(3)B is closed and the switchable shunt path 24(3)B is opened, a capacitance presented at the common port 18B of the switch device 12B from the switchable series path 22(3)B is maintained approximately the same so long as the switchable shunt path SCB is open.

However, the switch device 12B is configured to isolate both the filter circuit 32(5), the switchable series path 22(3)B, and the capacitive element 26(2)B when the switchable shunt path 24(3)B is closed and the switchable shunt path SCB is closed, regardless of whether the switchable series path 22(3)B is opened or closed. Accordingly, when the switchable shunt path 24(3)B is closed and the switchable shunt path SCB is closed, the switch device 12B is configured to not present the device capacitance (provided by the off switch capacitance CO(3)B and the capacitance of the capacitive element 26(3)B) and not present the filter capacitance of the filter circuit 32(5) to the common port 18B. In this manner, the RF port 20(1)B and the RF port 20(3)B are not loaded by either the device capacitance (provided by the off switch capacitance CO(3)B and the capacitance of the capacitive element 26(3)B) or the filter capacitance of the filter circuit 32(5).

Since the switch devices 12A, 12B in this embodiment each have more than one of the RF ports 20A, 20B and thus more than one of the switchable series paths 22A, 22B and more than one of the switchable shunt paths 24A, 24B, a total capacitance presented at the common port 18A is provided from the combination of the switchable series paths 22A. However, when one or more of the switchable shunt paths SCA, SCB is open, the total capacitance presented at the corresponding common port(s) 18A, 18B is maintained approximately unchanged regardless of which combination of the switchable series paths 22A, 22B and the associated switchable shunt paths 24A, 24B is selected to be opened/closed or closed/opened. To do this, each of the capacitive elements 26A, 26B is a variable capacitive element. Thus, the capacitance of the 26A, 26B is a variable capacitance that is set by the control circuitry 16.

The control circuitry 16 is configured to open and close the switchable series paths 22A, 22B, the switchable shunt paths 24A, 24B, and the switchable shunt paths SCA, SCB by turning off and turning on the switches 28A, 28B, 30A, 30B, SWA, SWB. In this embodiment, the control circuitry 16 is configured to generate a switch control output 40 and a switch control output 42. The switch device 12A is configured to receive the switch control output 40 and is responsive to the switch control output 40 so as to open and close the switches 28A, 30A, SWA, as described in this disclosure. More specifically, the switch control output 40 may have different permutations depending on which combination of the switchable series paths 22A, the switchable shunt paths 24A, and the switchable shunt path SCA is configured to be opened and closed. Thus, in accordance with the permutation of the switch control output 40, the appropriate combination of one or more of the switchable series paths 22A is opened, and the appropriate combination of the switchable shunt paths 24A is closed, so that RF signals can be routed from the common port 18A to the appropriate common port(s) 38(1), 38(2), 38(3) of the filtering circuitry 14. The switchable shunt path SCA is also opened and closed in accordance with the permutation of the switch control output 40 depending on whether the common port 18A is to be shorted to ground or the total capacitance presented to the common node 18A is to be resonated with the inductor RIA.

Furthermore, the switch device 12B is configured to receive the switch control output 42 and is responsive to the switch control output 42 so as to open and close the switches 28B, 30B, SWB, as described in this disclosure. More specifically, the switch control output 42 may have different permutations depending on which combination of the switchable series paths 22B, the switchable shunt paths 24B, and the switchable shunt path SCB is configured to be opened and closed. Thus, in accordance with the permutation of the switch control output 42, the appropriate combination of one or more of the switchable series paths 22B is opened, and the appropriate combination of the switchable shunt paths 24B is closed, so that RF signals can be routed from the common port 18B to the appropriate common port(s) 38(3), 38(4), 38(5) of the filtering circuitry 14. The switchable shunt path SCB is also opened and closed in accordance with the permutation of the switch control output 42 depending on whether the common port 18B is to be shorted to ground or the inductor RIB is to resonate with the total capacitance presented to the common port 18B.

The control circuitry 16 is configured to generate a tuning control output 44 so as to set the variable capacitances of the capacitive elements 26A of the switch device 12A, as described below. Additionally, the control circuitry 16 is configured to generate a tuning control output 46 so as to set the variable capacitances of the capacitive elements 26B of the switch device 12B, as described below. In this manner, the total capacitance presented at the common ports 18A, 18B is maintained approximately constant when resonated with the inductors RIA, RIB respectively.

FIGS. 2-8 illustrate the RF front end circuitry 10 shown in FIG. 1 where the control circuitry 16 has opened and closed different combinations of the switchable series paths 22A, 22B, the switchable shunt paths 24A, 24B of the switch device 12A, 12B. The control circuitry 16 is configured to provide the permutations of the switch control outputs 40, 42 so that the switchable series paths 22A, 22B, the switchable shunt paths 24A, 24B, and the switchable shunt paths SCA, SCB are opened and closed as described in FIGS. 2-8. Furthermore, the control circuitry 16 is configured to generate permutations of the tuning control outputs 44, 46 so the variable capacitances of the capacitive elements 26A, 26B maintain the total capacitance at the common port(s) 18A, 18B approximately the same when the corresponding switchable shunt path(s) SCA, SCB are open as described in FIGS. 2-8. Note that FIGS. 2-8 are simply illustrative, and the control circuitry 16 can provide permutations of the switch control outputs 40, 42 and permutations of the tuning control circuitry so that any combination of the switchable paths 22A, 22B, 24A, 24B, SCA, SCB is closed or opened including combinations not shown in FIGS. 2-8 for the sake of brevity.

Figure 2:
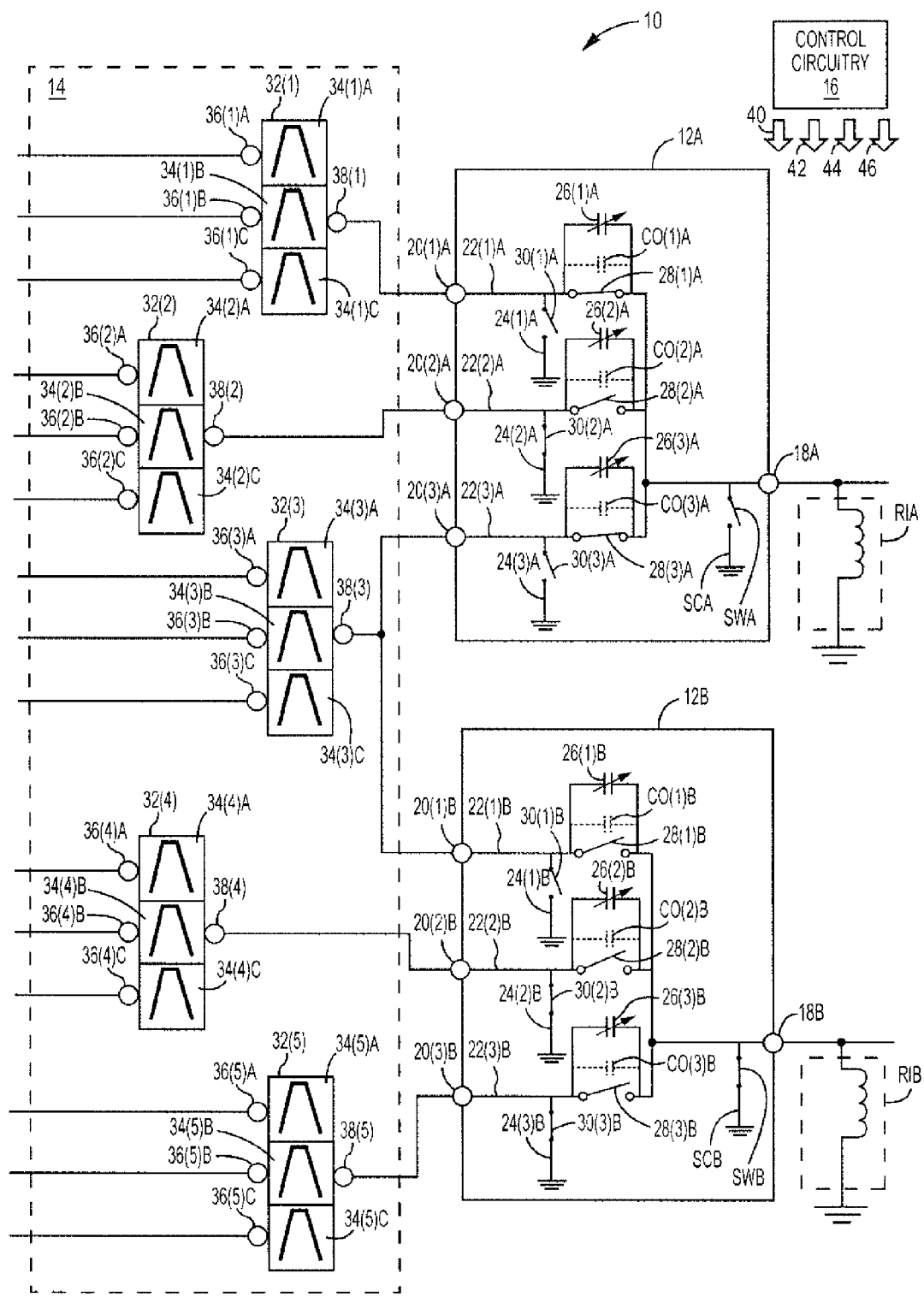
FIG. 2 illustrates the RF front end circuitry shown in FIG. 1 operating in a first carrier aggregation mode wherein the first switchable shunt path is open and the second switchable shunt path is closed so that carrier aggregation to a first common port of the first switch device.

FIG. 2 illustrates the RF front end circuitry 10 shown in FIG. 1 where the RF front end circuitry 10 is operating in a first carrier aggregation mode with the switch device 12A set to route an RF signal from the filter circuit 32(1) and to route another RF signal from the filter circuit 32(3) to the common port 18A. In FIG. 2, the control circuitry 16 has provided a permutation of the switch control output 40 to the switch device 12A where the permutation indicates that the switchable series path 22(1)A should be closed, the switchable shunt path 24(1)A should be open, the switchable series path 22(2)A should be opened, the switchable shunt path 24(2)A should be closed, the switchable series path 22(3)A should be closed, the switchable shunt path 24(3)A should be open and the switchable shunt path SCA should be open. The switch device 12A responds in accordance with the permutation of the switch control output 40 so that the switchable series path 22(1)A is closed, the switchable shunt path 24(1)A is opened, the switchable series path 22(2)A is opened, the switchable shunt path 24(2)A is closed, the switchable series path 22(3)A is closed, the switchable shunt path 24(3)A is open, and the switchable shunt path SCA is open.

More specifically, as shown in FIG. 2, the control circuitry 16 is configured to turn on the switch 28(1)A to close the switchable series path 22(1)A, to turn off the switch 30(1)A to open the switchable shunt path 24(1)A, to turn off the switch 28(2)A to open the switchable series path 22(2)A, to turn on the switch 30(2)A to close the switchable shunt path 24(2)A, to turn on the switch 28(3)A to close the switchable series path 22(3)A, to turn off the switch 30(3)A to open the switchable shunt path 24(3)A, and to turn off the switch SWA to open the switchable shunt path SCA. Since the switchable shunt path SCA is open, the switch device 12A presents approximately the filter capacitance of the filter circuit 32(1) to the common port 18A and does not present approximately the device capacitance provided by the off switch capacitance CO(1)A and the variable capacitance of the capacitive element 26(1)A to the common port 18A.

Furthermore, the switch device 12A does not present approximately the filter capacitance of the filter circuit 32(2) to the common port 18A but does present the approximate device capacitance provided by the off switch capacitance CO(2)A and the variable capacitance of the capacitive element 26(2)A to the common port 18A since the switchable shunt path SCA is open. Also, the switch device 12A presents approximately the filter capacitance of the filter circuit 32(1) from the RF port 20(3)A and approximately the device capacitance from the RF port 20(1)B provided by the off switch capacitance CO(1)B and the variable capacitance of the capacitive element 26(1)B to the common port 18A. Finally, the switch device 12A does not present the device capacitance provided by the off switch capacitance CO(3)A and the variable capacitance of the capacitive element 26(3)A to the common port 18A. In this manner, the RF signal from the filter circuit 32(1) and the RF signal from the filter circuit 32(3) are transmitted simultaneously to the common port 18A, thereby providing carrier aggregation.

In FIG. 2, the control circuitry 16 has provided a permutation of the switch control output 42 to the switch device 12B that indicates that the switchable series path 22(1)B should be opened, the switchable shunt path 24(1)B should be closed, the switchable series path 22(2)B should be opened, the switchable shunt path 24(2)B should be closed, the switchable series path 22(3)B should be opened, the switchable shunt path 24(3)B should be closed, and the switchable shunt path SCB should be closed. The switch device 12B responds in accordance with the permutation of the switch control output 42 so that the switchable series path 22(1)B is opened, the switchable shunt path 24(1)B is closed, the switchable series path 22(2)B is opened, the switchable shunt path 24(2)B is closed, the switchable series path 22(3)B is opened, the switchable shunt path 24(3)B is closed, and the switchable shunt path SCB is closed.

More specifically, as shown in FIG. 2, the control circuitry 16 is configured to turn off the switch 28(1)B to close the switchable series path 22(1)B, to turn off the switch 30(1)B to open the switchable shunt path 24(1)B, to turn off the switch 28(2)B to open the switchable series path 22(2)B, to turn on the switch 30(2)B to close the switchable shunt path 24(2)B, to turn off the switch 28(3)B to open the switchable series path 22(3)B, to turn on the switch 30(3)B to close the switchable shunt path 24(3)B, and to turn on the switch SWB to close the switchable shunt path SCB. Since the switchable shunt path SCB is closed, the common port 18B is shorted to ground, thereby shorting the inductor RIB. Also, the switch device 12B isolates the filter circuit 32(4), the switchable series path 22(2)B, the capacitive element 26(2)B, the filter circuit 32(5), the switchable series path 22(3)B, and the capacitive element 26(3)B from the RF port 20(1)B, since the switchable shunt path 24(2)B, the switchable shunt path 24(3)B, and the switchable shunt path SWB are closed simultaneously. Accordingly, the switch device 12B does not present approximately the filter capacitance of the filter circuit 32(4) to the RF port 20(1)B and does not present approximately the device capacitance provided by the off switch capacitance CO(2)B and the variable capacitance of the capacitive element 26(2)B to the RF port 20(1)B. Furthermore, the switch device 12B does not present approximately the filter capacitance of the filter circuit 32(5) to the RF port 20(1)B and does not present approximately the device capacitance provided by the off switch capacitance CO(3)B and the variable capacitance of the capacitive element 26(3)B to the RF port 20(1)B. However, since the switchable shunt path SCB is closed and both the switchable series path 22(1)B and the switchable shunt path 24(1)B are open, the switch device 12B presents the device capacitance provided by the off switch capacitance CO(1)B and the variable capacitance of the capacitive element 26(1)B to the RF port 20(1)B. Thus, the switch device 12A presents approximately the filter capacitance of the filter circuit 32(3) from the RF port 20(3)A and approximately the device capacitance from the RF port 20(1)B provided by the off switch capacitance CO(1)B and the variable capacitance of the capacitive element 26(1)B to the common port 18A. In this manner, the device capacitance provided by the off switch capacitance CO(1)B and the variable capacitance of the capacitive element 26(1)B are utilized to tune the capacitance seen at the RF port 20(3)A of the switch device 12A without requiring an additional variable capacitive element to be directly connected at filter circuit 32(3) for tuning.

In FIG. 2, the control circuitry 16 has provided a permutation of the tuning control output 44 to the switch device 12A with either no change to the variable capacitance of the capacitive element 26(1)A or has set the variable capacitance to a default capacitance level (e.g., a minimum capacitance level) because the switchable series path 22(1)A is closed in the first carrier aggregation mode. Thus, the filter circuit 32(1) is not isolated from the common port 18A in the first carrier aggregation mode and the switch device 12A presents the filter capacitance of the filter circuit 32(1) from the RF port 20(1)A is presented at the common port 18A.

With regard to the filter circuit 32(2), the filter circuit 32(2) is isolated from the common port 18A in the first carrier aggregation mode from the common port 18A. Thus, the permutation of the tuning control output 44 provided to the switch device 12A also indicates that the variable capacitance of the capacitive element 26(2)A which sets the device capacitance presented by the off switch capacitance CO(2)A and the variable capacitance of the capacitive element 26(2)A approximately equal the filter capacitance of the filter circuit 32(2).

With regard to the filter circuit 32(3), the permutation of the tuning control output 44 provided to the switch device 12A indicates either no change to the variable capacitance of the capacitive element 26(3)A or sets the variable capacitance to a default capacitance level (e.g., a minimum capacitance level) because the switchable series path 22(3)A is closed in the first carrier aggregation mode. Thus, the filter circuit 32(3) is not isolated from the common port 18A in the first carrier aggregation mode and the switch device 12A presents the filter capacitance of the filter circuit 32(3) from the RF port 20(1)A is presented at the common port 18A.

In FIG. 2, the control circuitry 16 has also provided the permutation of the tuning control output 46 to the switch device 12B that indicates the variable capacitance of the capacitive element 26(1)B which sets the device capacitance presented by the off switch capacitance CO(1)B and the variable capacitance of the capacitive element 26(1)B approximately equal to the filter capacitance of the filter circuit 32(4). Thus, in the first carrier aggregation mode, approximately the device capacitance presented by the off switch capacitance CO(1)B and the variable capacitance of the capacitive element 26(1)B are provided at the common port 18A. Carrier aggregation with the filter circuit 32(4) also involves the filter circuit 32(4), as explained in further detail below. As such, although the filter circuit 32(4) is isolated from the common port 18A in the first carrier aggregation mode, the filter circuit 32(3) continues to see a consistent capacitance during operation since the device capacitance presented by the off switch capacitance CO(1)B and the variable capacitance of the capacitive element 26(1)B approximately equal to the filter capacitance of the filter circuit 32(4).

With regard to the filter circuit 32(4), the permutation of the tuning control output 46 provided to the switch device 12B indicates either no change to the variable capacitance of the capacitive element 26(2)B or sets the variable capacitance to a default capacitance level (e.g., a minimum capacitance level) because the switchable shunt path 24(2)B is closed and the switchable shunt path SCB is closed in the first carrier aggregation mode. Thus, the filter circuit 32(4) is isolated from the common port 18A in the first carrier aggregation mode.

With regard to the filter circuit 32(5), the permutation of the tuning control output 46 provided to the switch device 12B indicates either no change to the variable capacitance of the capacitive element 26(3)B or sets the variable capacitance to a default capacitance level (e.g., a minimum capacitance level) because the switchable shunt path 24(3)B is closed and the switchable shunt path SCB is closed in the first carrier aggregation mode. Thus, the filter circuit 32(5) is isolated from the common port 18A in the first carrier aggregation mode.

Accordingly, in response to the tuning control output 44, the switch device 12A sets the variable capacitance of the capacitive element 26(2)A so that the device capacitance presented by the off switch capacitance CO(2)A and the variable capacitance of the capacitive element 26(2)A approximately equal the filter capacitance of the filter circuit 32(2). On the other hand, in response to the tuning control output 44, the switch device 12A does not change the variable capacitance of the capacitive element 26(1)A and the variable capacitance of the capacitive element 26(3)A, but rather sets them both to a default capacitance level (e.g., minimum capacitance level).

Furthermore, in response to the tuning control output 46, the switch device 12B sets the variable capacitance of the capacitive element 26(1)B so that the device capacitance presented by the off switch capacitance CO(1)B and the variable capacitance of the capacitive element 26(1)B approximately equal the filter capacitance of the filter circuit 32(4). On the other hand, in response to the tuning control output 46, the switch device 12B does not change the variable capacitance of the capacitive element 26(2)B and the variable capacitance of the capacitive element 26(3)B, but rather sets them both to a default capacitance level (e.g., minimum capacitance level).

Figure 3:
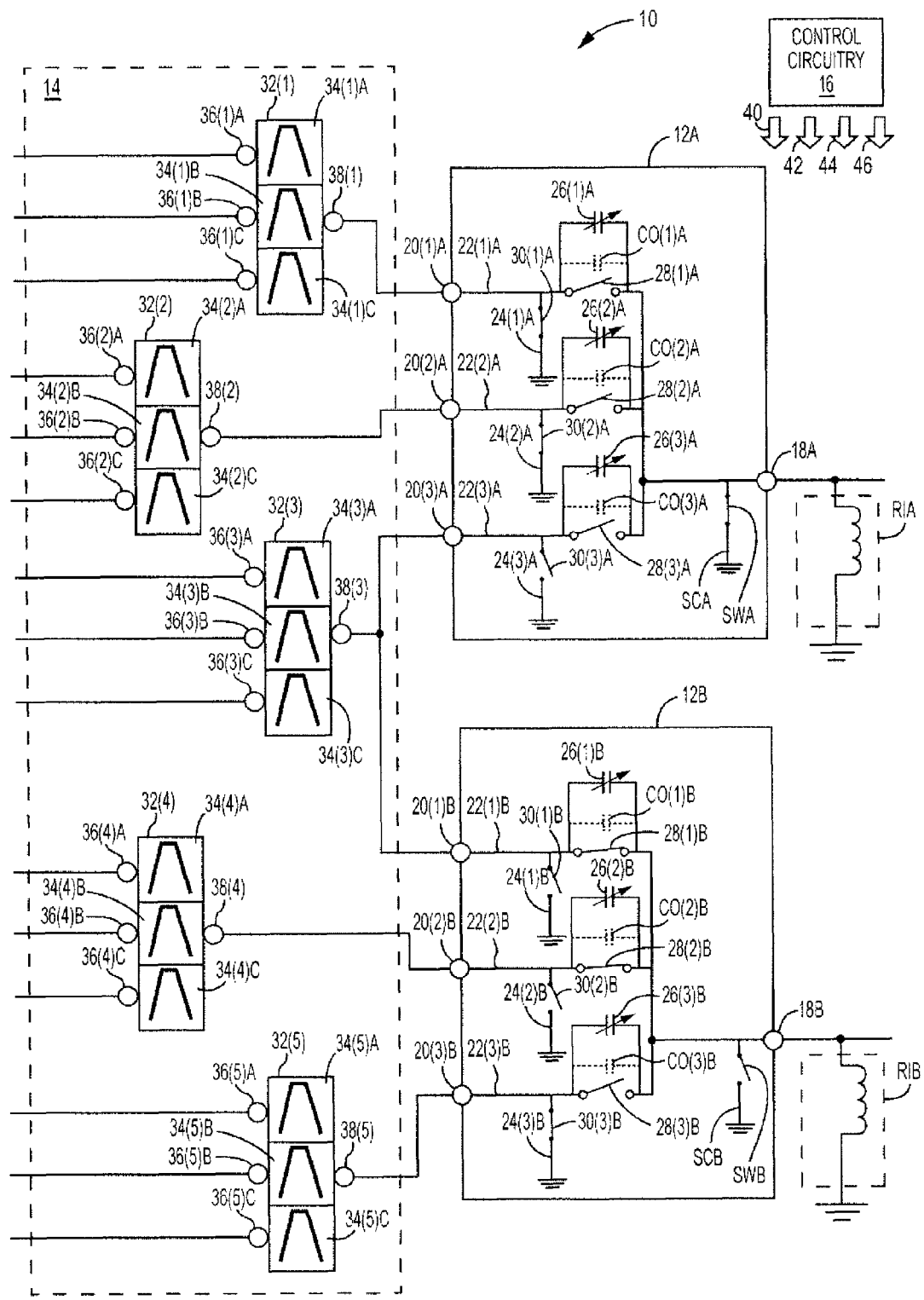
FIG. 3 illustrates the RF front end circuitry shown in FIG. 1 operating in a second carrier aggregation mode wherein the first switchable shunt path is closed and the second switchable shunt path is open so that carrier aggregation to a second common port of the second switch device.

FIG. 3 illustrates the RF front end circuitry 10 shown in FIG. 1 where the RF front end circuitry 10 is operating in a second carrier aggregation mode with the switch device 12B set to route an RF signal from the filter circuit 32(4) and to route another RF signal from the filter circuit 32(3) to the common port 18B. In FIG. 3, the control circuitry 16 has provided a permutation of the switch control output 40 to the switch device 12A that indicates that the switchable series path 22(1)A should be open, the switchable shunt path 24(1)A should be closed, the switchable series path 22(2)A should be opened, the switchable shunt path 24(2)A should be closed, the switchable series path 22(3)A should be opened, the switchable shunt path 24(3)A should be opened, and the switchable shunt path SCA should be closed. The switch device 12A responds in accordance with the permutation of the switch control output 40 so that the switchable series path 22(1)A is opened, the switchable shunt path 24(1)A is closed, the switchable series path 22(2)A is opened, the switchable shunt path 24(2)A is closed, the switchable series path 22(3)A is opened, the switchable shunt path 24(3)A is opened, and the switchable shunt path SCA is closed.

More specifically, as shown in FIG. 3, the control circuitry 16 is configured to turn off the switch 28(1)A to open the switchable series path 22(1)A, to turn on the switch 30(1)A to close the switchable shunt path 24(1)A, to turn off the switch 28(2)A to open the switchable series path 22(2)A, to turn on the switch 30(2)A to close the switchable shunt path 24(2)A, to turn off the switch 28(3)A to open the switchable series path 22(3)A, to turn off the switch 30(3)A to open the switchable shunt path 24(3)A and to turn on the switch SWA to close the switchable shunt path SCA. Since the switchable shunt path SCA is closed, the common port 18A is shorted to ground, thereby shorting the inductor RIA to ground. Also, the switch device 12A isolates the filter circuit 32(1), the switchable series path 22(1)A, the capacitive element 26(1)A, the filter circuit 32(2), the switchable series path 22(2)A, and the capacitive element 26(2)A from the RF port 20(3)A, since the switchable shunt path 24(1)A, the switchable shunt path 24(2)A, and the switchable shunt path SCA are closed simultaneously. Accordingly, the switch device 12A does not present approximately the filter capacitance of the filter circuit 32(1) to the RF port 20(3)A and does not present approximately the device capacitance provided by the off switch capacitance CO(1)A and the variable capacitance of the capacitive element 26(1)A to the RF port 20(3)A. Furthermore, the switch device 12A does not present approximately the filter capacitance of the filter circuit 32(2) to the RF port 20(3)A and does not present approximately the device capacitance provided by the off switch capacitance CO(2)A and the variable capacitance of the capacitive element 26(2)A to the RF port 20(3)A. However, since the switchable shunt path SCA is closed and both the switchable series path 22(3)A and the switchable shunt path 24(3)A are open, the switch device 12A presents the device capacitance provided by the off switch capacitance CO(3)A and the variable capacitance of the capacitive element 26(3)A to the RF port 20(3)A. Thus, the device capacitance provided by the off switch capacitance CO(3)A and the variable capacitance of the capacitive element 26(3)A and the filter capacitance of the filter circuit 32(3) are presented to the RF port 20(1)B of the switch device 12B. In this manner, the device capacitance provided by the off switch capacitance CO(3)A and the variable capacitance of the capacitive element 26(3)A are utilized to tune the capacitance seen at the RF port 20(1)B of the switch device 12B without requiring an additional variable capacitive element to be directly connected at filter circuit 32(3) for tuning.

In FIG. 3, the control circuitry 16 has provided a permutation of the switch control output 42 to the switch device 12B where the permutation indicates that the switchable series path 22(1)B should be closed, the switchable shunt path 24(1)B should be open, the switchable series path 22(2)B should be closed, the switchable shunt path 24(2)B should be open, the switchable series path 22(3)B should be open, the switchable shunt path 24(3)B should be closed, and the switchable shunt path SCB should be open. The switch device 12B responds in accordance with the permutation of the switch control output 42 so that the switchable series path 22(1)B is closed, the switchable shunt path 24(1)B is opened, the switchable series path 22(2)B is closed, the switchable shunt path 24(2)B is opened, the switchable series path 22(3)B is opened, the switchable shunt path 24(3)B is closed, and the switchable shunt path SCB is opened.

More specifically, as shown in FIG. 3, the control circuitry 16 is configured to turn on the switch 28(1)B to close the switchable series path 22(1)B, to turn off the switch 30(1)B to open the switchable shunt path 24(1)B, to turn on the switch 28(2)B to close the switchable series path 22(2)B, to turn off the switch 30(2)B to open the switchable shunt path 24(2)B, to turn off the switch 28(3)B to open the switchable series path 22(3)B, to turn on the switch 30(3)B to close the switchable shunt path 24(3)B, and to turn off the switch SWB to open the switchable shunt path SCB. Since the switchable shunt path SCB is open, the switch device 12B presents approximately the filter capacitance of the filter circuit 32(4) to the common port 18B but does not present approximately the device capacitance provided by the off switch capacitance CO(2)B and the variable capacitance of the capacitive element 26(2)B to the common port 18B. Furthermore, the switch device 12B does not present approximately the filter capacitance of the filter circuit 32(5) to the common port 18B but does present the approximate device capacitance provided by the off switch capacitance CO(3)B and the variable capacitance of the capacitive element 26(3)B to the common port 18B.

Note that the device capacitance provided by the off switch capacitance CO(3)A and the variable capacitance of the capacitive element 26(3)A is presented from the RF port 20(3)A to the RF port 20(1)B in the second carrier aggregation mode. Thus, the switch device 12B presents approximately the device capacitance provided by the off switch capacitance CO(3)A and the variable capacitance of the capacitive element 26(3)A from the RF port 20(1)B to the common port 18B. Accordingly, the switch device 12B presents approximately the filter capacitance of the filter circuit 32(3) and the device capacitance provided by the off switch capacitance CO(3)A and the variable capacitance of the capacitive element 26(3)A from the RF port 20(1)B to the common port 18B. Finally, the switch device 12B does not present the device capacitance provided by the off switch capacitance CO(1)B and the variable capacitance of the capacitive element 26(1)B to the common port 18B since the switchable series path 22(1)B is closed and the switchable shunt path 24(1)(B) is open. In this manner, the RF signal from the filter circuit 32(3) and the RF signal from the filter circuit 32(4) are transmitted simultaneously to the common port 18B thereby providing carrier aggregation.

In FIG. 3, the control circuitry 16 provides a permutation of the tuning control output 44 to the switch device 12A indicates either no change to the variable capacitance of the capacitive element 26(1)A or sets the variable capacitance to a default capacitance level (e.g., a minimum capacitance level) because the switchable shunt path 24(1)A is closed and the switchable shunt path SCA is closed in the second carrier aggregation mode. Thus, the filter circuit 32(1) is isolated from the common port 18B in the second carrier aggregation mode.

With regard to the filter circuit 32(2), the permutation of the tuning control output 44 provided to the switch device 12A indicates either no change to the variable capacitance of the capacitive element 26(2)A or sets the variable capacitance to a default capacitance level (e.g., a minimum capacitance level) because the switchable shunt path 24(2)A is closed and the switchable shunt path SCA is closed in the second carrier aggregation mode. Thus, the filter circuit 32(2) is isolated from the common port 18B in the second carrier aggregation mode.

With regard to the filter circuit 32(3), the permutation of the tuning control output 44 provided to the switch device 12A that indicates the variable capacitance of the capacitive element 26(3)A which sets the device capacitance presented by the off switch capacitance CO(3)A and the variable capacitance of the capacitive element 26(3)A approximately equal to the filter capacitance of the filter circuit 32(1). As such, although the filter circuit 32(1) is isolated from the common port 18B in the second carrier aggregation mode, the filter circuit 32(3) continues to see a consistent capacitance during operation since the device capacitance presented by the off switch capacitance CO(3)A and the variable capacitance of the capacitive element 26(3)A approximately equal to the filter capacitance of the filter circuit 32(1).

Accordingly, in response to the tuning control output 44, the switch device 12A sets the variable capacitance of the capacitive element 26(3)A so that the device capacitance presented by the off switch capacitance CO(3)A and the variable capacitance of the capacitive element 26(3)A approximately equal the filter capacitance of the filter circuit 32(1). On the other hand, in response to the tuning control output 44, the switch device 12A does not change the variable capacitance of the capacitive element 26(1)A and the variable capacitance of the capacitive element 26(2)A or rather sets them both to a default capacitance level (e.g., minimum capacitance level).

In FIG. 3, the control circuitry 16 provides a permutation of the tuning control output 46 to the switch device 12B that provides either no change to the variable capacitance of the capacitive element 26(1)B or sets the variable capacitance of the capacitive element 26(1)B to a default capacitance level (e.g., a minimum capacitance level) because the switchable series path 22(1)B is closed in the second carrier aggregation mode. Thus, the filter circuit 32(3) and the RF port 20(3)A of the first switch device 12A is not isolated from the common port 18B in the second carrier aggregation mode. The switch device 12B thus presents the filter capacitance of the filter circuit 32(3) and the device capacitance provided by the off switch capacitance CO(3)A and the variable capacitance of the capacitive element 26(3)A from the RF port 20(1)B to the common port 18B.

With regard to the filter circuit 32(4), the control circuitry 16 provides the permutation of the tuning control output 46 to the switch device 12B that provides either no change to the variable capacitance of the capacitive element 26(2)B or sets the variable capacitance of the capacitive element 26(2)B to a default capacitance level (e.g., a minimum capacitance level) because the switchable series path 22(2)B is closed in the second carrier aggregation mode. The filter circuit 32(4) is not isolated from the common port 18B in the second carrier aggregation mode. Thus, the switch device 12B presents the filter capacitance of the filter circuit 32(4) from the RF port 20(2)B to the common port 18B in the second carrier aggregation mode. However, the switch device 12B does not present the device capacitance provided by the off switch capacitance CO(2)B and the variable capacitance of the capacitive element 26(2)B to the common port 18B since the switchable series path 22(2)B is closed and the switchable shunt path 24(2)B is open.

With regard to the filter circuit 32(5), the filter circuit 32(5) is isolated from the common port 18B in the second carrier aggregation mode. Thus, the permutation of the tuning control output 46 provided to the switch device 12B also indicates that the variable capacitance of the capacitive element 26(3)B which sets the device capacitance presented by the off switch capacitance CO(3)B and the variable capacitance of the capacitive element 26(3)B approximately equal to the filter capacitance of the filter circuit 32(5). However, the switch device 12B does not present the filter capacitance of the filter circuit 32(5) to the common port 18B in the second carrier aggregation mode Accordingly, in response to the tuning control output 46, the switch device 12B sets the variable capacitance of the capacitive element 26(3)B so that the device capacitance presented by the off switch capacitance CO(3)B and the variable capacitance of the capacitive element 26(3)B approximately equal the filter capacitance of the filter circuit 32(5). On the other hand, in response to the tuning control output 46, the switch device 12B does not change the variable capacitance of the capacitive element 26(2)B and the variable capacitance of the capacitive element 26(1)B but rather sets them both to a default capacitance level (e.g., minimum capacitance level).

Figure 4:
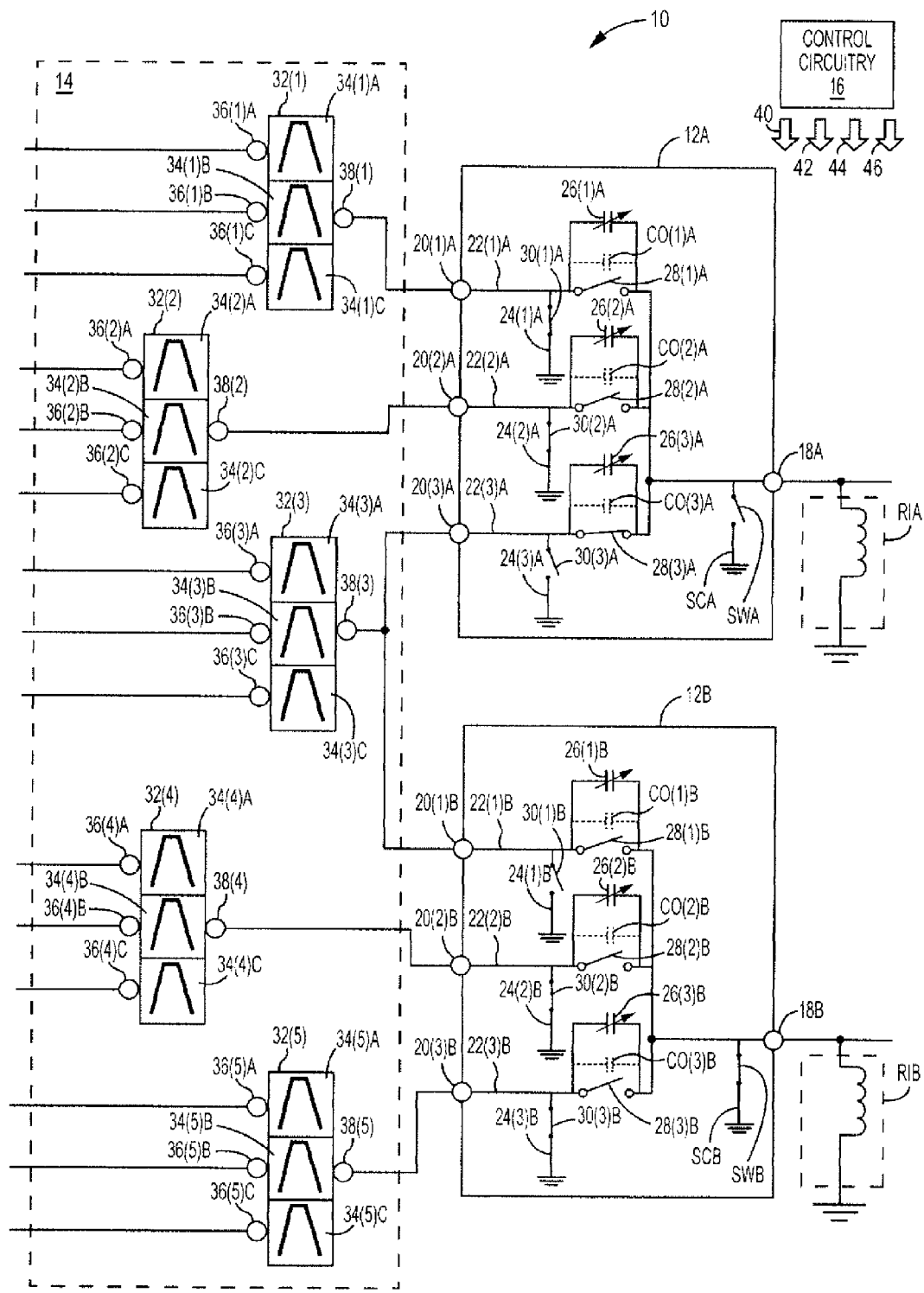
FIG. 4 illustrates the RF front end circuitry shown in FIG. 1 operating in a first non-carrier aggregation mode wherein a filter circuit connected to both the first switch device and the second switch device is providing an RF signal to the first common port.

FIG. 4 illustrates the RF front end circuitry 10 shown in FIG. 1 where the RF front end circuitry 10 is operating in a first non-carrier aggregation mode with the switch device 12A set to route only the RF signal from the filter circuit 32(3) to the common port 18A. Unlike the first carrier aggregation mode described above in FIG. 2, the RF signal from the filter circuit 32(1) is not routed to the common port 18A in the first non-carrier aggregation mode. In FIG. 4, the control circuitry 16 has provided a permutation of the switch control output 40 to the switch device 12A where the permutation indicates that the switchable series path 22(1)A should be opened, the switchable shunt path 24(1)A should be closed, the switchable series path 22(2)A should be opened, the switchable shunt path 24(2)A should be closed, the switchable series path 22(3)A should be closed, the switchable shunt path 24(3)A should be opened, and the switchable shunt path SCA should be opened. The switch device 12A responds in accordance with the permutation of the switch control output 40 so that the switchable series path 22(1)A is opened, the switchable shunt path 24(1)A is closed, the switchable series path 22(2)A is opened, the switchable shunt path 24(2)A is closed, the switchable series path 22(3)A is closed, the switchable shunt path 24(3)A is open, and the switchable shunt path SCA is open.

More specifically, as shown in FIG. 4, the control circuitry 16 is configured to turn off the switch 28(1)A to open the switchable series path 22(1)A, to turn on the switch 30(1)A to close the switchable shunt path 24(1)A, to turn off the switch 28(2)A to open the switchable series path 22(2)A, to turn on the switch 30(2)A to close the switchable shunt path 24(2)A, to turn on the switch 28(3)A to close the switchable series path 22(3)A, to turn off the switch 30(3)A to open the switchable shunt path 24(3)A, and to turn off the switch SWA to open the switchable shunt path SCA.

As such, in the first non-carrier aggregation mode, the switch device 12A does not present approximately the filter capacitance of the filter circuit 32(1) to the common port 18A and does not present approximately the filter capacitance of the filter circuit 32(2) to the common port 18A. However, since the switchable shunt path SCA is open, the switch device 12A does present the approximate filter capacitance of the filter circuit 32(3) from the RF port 20(3)A to the common port 18A. The switch device 12A also does present the approximate device capacitance presented by the off switch capacitance CO(1)A and the variable capacitance of the capacitive element 26(1)A to the common port 18A and does present the approximate device capacitance provided by the off switch capacitance CO(2)A and the variable capacitance of the capacitive element 26(2)A to the common port 18A. Finally, the switch device 12A does not present the device capacitance provided by the off switch capacitance CO(3)A and the variable capacitance of the capacitive element 26(3)A to the common port 18A. In this manner, the RF signal from the filter circuit 32(3) is transmitted simultaneously to the common port 18A.

In FIG. 4, the control circuitry 16 has provided a permutation of the switch control output 42 to the switch device 12B that indicates that the switchable series path 22(1)B should be opened, the switchable shunt path 24(1)B should be opened, the switchable series path 22(2)B should be opened, the switchable shunt path 24(2)B should be closed, the switchable series path 22(3)B should be opened, the switchable shunt path 24(3)B should be closed, and the switchable shunt path SCB should be closed. The switch device 12B responds in accordance with the permutation of the switch control output 42 so that the switchable series path 22(1)B is opened, the switchable shunt path 24(1)B is opened, the switchable series path 22(2)B is opened, the switchable shunt path 24(2)B is closed, the switchable series path 22(3)B is opened, the switchable shunt path 24(3)B is closed, and the switchable shunt path SCB is closed.

More specifically, as shown in FIG. 4, the control circuitry 16 is configured to turn off the switch 28(1)B to open the switchable series path 22(1)B, to turn off the switch 30(1)B to open the switchable shunt path 24(1)B, to turn off the switch 28(2)B to open the switchable series path 22(2)B, to turn on the switch 30(2)B to close the switchable shunt path 24(2)B, to turn off the switch 28(3)B to open the switchable series path 22(3)B, to turn on the switch 30(3)B to close the switchable shunt path 24(3)B, and to turn on the switch SWB to close the switchable shunt path SCB. Since the switchable shunt path SCB is closed, the common port 18B is shorted to ground, thereby shorting the inductor RIB. Also, the switch device 12B isolates the filter circuit 32(4), the switchable series path 22(2)B, the capacitive element 26(2)B, the filter circuit 32(5), the switchable series path 22(3)B, and the capacitive element 26(3)B from the RF port 20(1)B since the switchable shunt path 24(2)B, the switchable shunt path 24(3)B, and the switchable shunt path SWB are closed simultaneously. Accordingly, the switch device 12B does not present approximately the filter capacitance of the filter circuit 32(4) to the RF port 20(1)B and does not present approximately the device capacitance provided by the off switch capacitance CO(2)B and the variable capacitance of the capacitive element 26(2)B to the RF port 20(1)B. Furthermore, the switch device 12B does not present approximately the filter capacitance of the filter circuit 32(5) to the RF port 20(1)B and does not present approximately the device capacitance provided by the off switch capacitance CO(3)B and the variable capacitance of the capacitive element 26(3)B to the RF port 20(1)B.

However, since the switchable shunt path SCB is closed and both the switchable series path 22(1)B and the switchable shunt path 24(1)B are open, the switch device 12B presents the device capacitance provided by the off switch capacitance CO(1)B and the variable capacitance of the capacitive element 26(1)B to the RF port 20(1)B. The device capacitance provided by the off switch capacitance CO(1)B and the variable capacitance of the capacitive element 26(1)B are thus presented from the RF port 20(1)B to the RF port 20(3)A of the switch device 12A. Thus, in the first non-carrier aggregation mode, the switch device 12A presents approximately the filter capacitance of the filter circuit 32(3) and the device capacitance provided by the off switch capacitance CO(1)B and the variable capacitance of the capacitive element 26(1)B from the RF port 20(1)B to the common port 18A. In this manner, the device capacitance provided by the off switch capacitance CO(1)B and the variable capacitance of the capacitive element 26(1)B are utilized to tune the capacitance seen at the RF port 20(3)A of the switch device 12A without requiring an additional variable capacitive element to be directly connected at filter circuit 32(3) for tuning.

In the first non-carrier aggregation mode, the filter circuit 32(1) is isolated from the common port 18A as shown in FIG. 4. As such, the filter capacitance of the filter circuit 32(1) is not presented to the common port 18A. Accordingly, the control circuitry 16 has provided a permutation of the tuning control output 44 to the switch device 12A which also indicates that the variable capacitance of the capacitive element 26(1)A which sets the device capacitance presented by the off switch capacitance CO(1)A and the variable capacitance of the capacitive element 26(1)A approximately equal to the filter capacitance of the filter circuit 32(1).

With regard to the filter circuit 32(2), the filter circuit 32(2) is isolated from the common port 18A in the first non-carrier aggregation mode from the common port 18A. As such, the filter capacitance of the filter circuit 32(2) is not presented to the common port 18A. Thus, the permutation of the tuning control output 44 provided to the switch device 12A also indicates the variable capacitance of the capacitive element 26(2)A, which sets the device capacitance presented by the off switch capacitance CO(2)A and the variable capacitance of the capacitive element 26(2)A approximately equal to the filter capacitance of the filter circuit 32(2). As such, although the filter circuit 32(1) and the filter circuit 32(2) are isolated from the common port 18A in the first non-carrier aggregation mode, the common port 18A and the filter circuit 32(3) continue to see a consistent capacitance during operation since the device capacitance presented by the off switch capacitance CO(1)A and the variable capacitance of the capacitive element 26(1)A are set approximately equal to the filter capacitance of the filter circuit 32(1), and the device capacitance presented by the off switch capacitance CO(2)A and the variable capacitance of the capacitive element 26(2)A are set approximately equal to the filter capacitance of the filter circuit 32(2).

With regard to the filter circuit 32(3), the permutation of the tuning control output 44 provided to the switch device 12A indicates either no change to the variable capacitance of the capacitive element 26(3)A or sets the variable capacitance to a default capacitance level (e.g., a minimum capacitance level) because the switchable series path 22(3)A is closed in the first non-carrier aggregation mode. Thus, the filter circuit 32(3) is not isolated from the common port 18A in the first non-carrier aggregation mode and the switch device 12A presents approximately the filter capacitance of the filter circuit 32(3) from the RF port 20(3)A to common port 18A.

In FIG. 4, the control circuitry 16 has also provided the permutation of the tuning control output 46 to the switch device 12B that indicates the variable capacitance of the capacitive element 26(1)B which sets the device capacitance presented by the off switch capacitance CO(1)B and the variable capacitance of the capacitive element 26(1)B approximately equal to the filter capacitance of the filter circuit 32(4). Thus, in the first non-carrier aggregation mode, the switch device 12A presents approximately the filter capacitance of the filter circuit 32(3) and the device capacitance presented by the off switch capacitance CO(1)B from and the variable capacitance of the capacitive element 26(1)B from the RF port 20(3)A common port 18A. Carrier aggregation with the filter circuit 32(4) also involves the filter circuit 32(4), as explained in further detail above in FIG. 2. As such, although the filter circuit 32(4) is isolated from the common port 18A in the first non-carrier aggregation mode, the filter circuit 32(3) continues to see a consistent capacitance during operation, since the device capacitance presented by the off switch capacitance CO(1)B and the variable capacitance of the capacitive element 26(1)B are set to approximately equal the filter capacitance of the filter circuit 32(4).

With regard to the filter circuit 32(4), the permutation of the tuning control output 46 provided to the switch device 12B indicates either no change to the variable capacitance of the capacitive element 26(2)B or sets the variable capacitance to a default capacitance level (e.g., a minimum capacitance level) because the switchable shunt path 24(2)B is closed and the switchable shunt path SCB is closed in the first non-carrier aggregation mode. Thus, the filter circuit 32(4) is isolated from the common port 18A in the first non-carrier aggregation mode.

With regard to the filter circuit 32(5), the permutation of the tuning control output 46 provided to the switch device 12B indicates either no change to the variable capacitance of the capacitive element 26(3)B or sets the variable capacitance to a default capacitance level (e.g., a minimum capacitance level) because the switchable shunt path 24(3)B is closed and the switchable shunt path SCB is closed in the first non-carrier aggregation mode. Thus, the filter circuit 32(5) is isolated from the common port 18A in the first non-carrier aggregation mode.

Accordingly, in response to the tuning control output 44, the switch device 12A sets the variable capacitance of the capacitive element 26(1)A so that the device capacitance presented by the off switch capacitance CO(1)A and the variable capacitance of the capacitive element 26(1)A approximately equal the filter capacitance of the filter circuit 32(1). Also, the switch device 12A sets the variable capacitance of the capacitive element 26(2)A so that the device capacitance presented by the off switch capacitance CO(2)A and the variable capacitance of the capacitive element 26(2)A approximately equal the filter capacitance of the filter circuit 32(2). On the other hand, in response to the tuning control output 44, the switch device 12A does not change the variable capacitance of the capacitive element 26(3)A, but rather sets it to a default capacitance level (e.g., minimum capacitance level). In this manner, the inductor RIA resonates with a total capacitance at the common node 18A approximately equal to the total capacitance at the common node 18A described above with respect to FIG. 2.

Furthermore, in response to the tuning control output 46, the switch device 12B sets the variable capacitance of the capacitive element 26(1)B so that the device capacitance presented by the off switch capacitance CO(1)B and the variable capacitance of the capacitive element 26(1)B approximately equal the filter capacitance of the filter circuit 32(4). On the other hand, in response to the tuning control output 46, the switch device 12B does not change the variable capacitance of the capacitive element 26(2)B and the variable capacitance of the capacitive element 26(3)B, but rather sets them both to a default capacitance level (e.g., minimum capacitance level).

Figure 5:
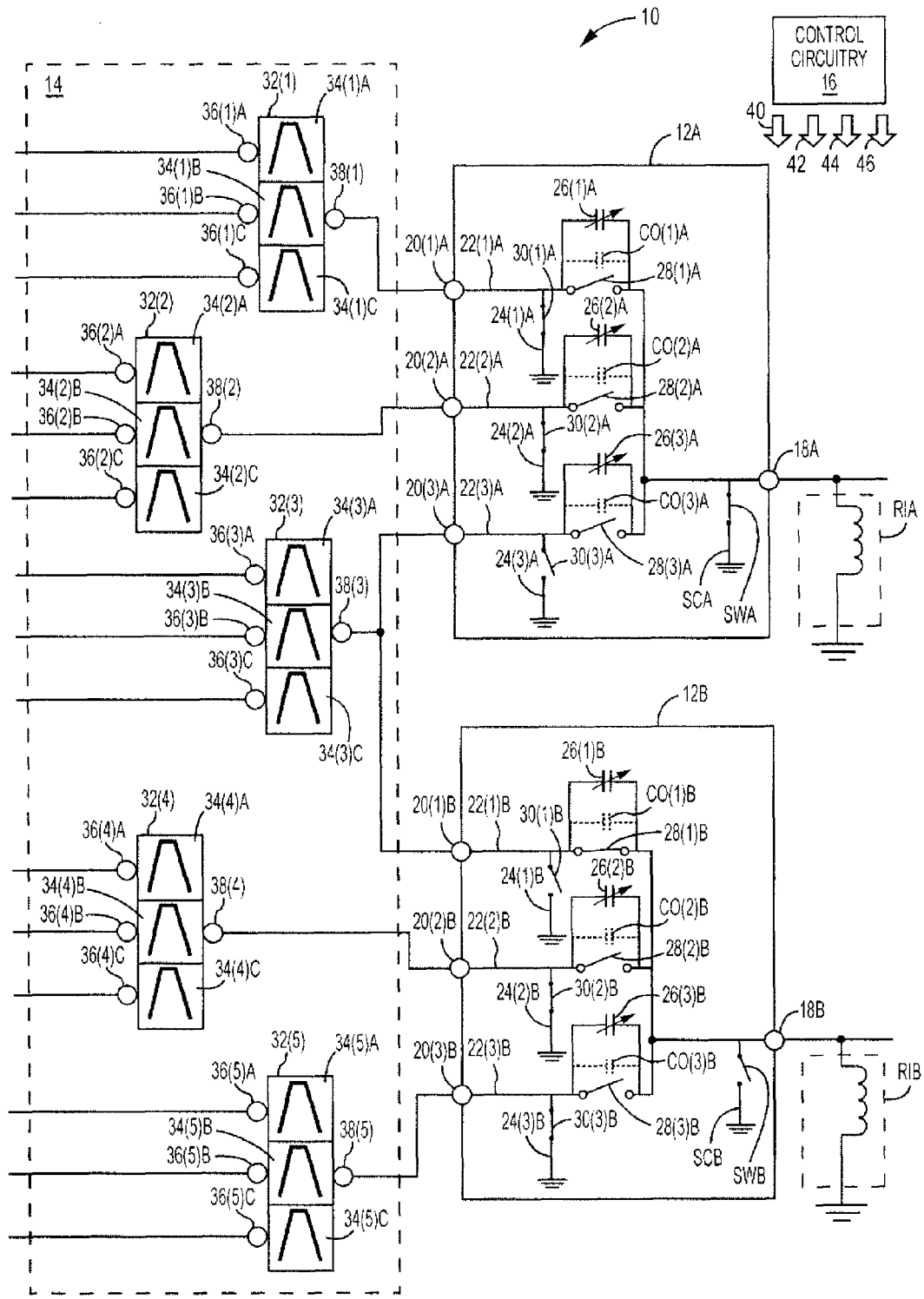
FIG. 5 illustrates the RF front end circuitry shown in FIG. 1 operating in a second non-carrier aggregation mode wherein a filter circuit connected to both the first switch device and the second switch device is providing an RF signal to the second common port.

FIG. 5 illustrates the RF front end circuitry 10 shown in FIG. 1 where the RF front end circuitry 10 is operating in a second non-carrier aggregation mode with the switch device 12B to route only the RF signal from the filter circuit 32(3) to the common port 18B. In FIG. 5, the control circuitry 16 has provided a permutation of the switch control output 40 to the switch device 12A that indicates that the switchable series path 22(1)A should be opened, the switchable shunt path 24(1)A should be closed, the switchable series path 22(2)A should be opened, the switchable shunt path 24(2)A should be closed, the switchable series path 22(3)A should be opened, the switchable shunt path 24(3)A should be opened, and the switchable shunt path SCA should be closed. The switch device 12A responds in accordance with the permutation of the switch control output 40 so that the switchable series path 22(1)A is opened, the switchable shunt path 24(1)A is closed, the switchable series path 22(2)A is opened, the switchable shunt path 24(2)A is closed, the switchable series path 22(3)A is opened, the switchable shunt path 24(3)A is opened, and the switchable shunt path SCA is closed.

More specifically, as shown in FIG. 5, the control circuitry 16 is configured to turn off the switch 28(1)A to open the switchable series path 22(1)A, to turn on the switch 30(1)A to close the switchable shunt path 24(1)A, to turn off the switch 28(2)A to open the switchable series path 22(2)A, to turn on the switch 30(2)A to close the switchable shunt path 24(2)A, to turn off the switch 28(3)A to open the switchable series path 22(3)A, to turn off the switch 30(3)A to open the switchable shunt path 24(3)A and to turn on the switch SWA to close the switchable shunt path SCA.

Since the switchable shunt path SCA is closed, the common port 18A is shorted to ground, thereby shorting the inductor RIA. Also, the switch device 12A isolates the filter circuit 32(1), the switchable series path 22(1)A, the capacitive element 26(1)A, the filter circuit 32(2), the switchable series path 22(2)A, and the capacitive element 26(2)A from the RF port 20(3)A, since the switchable shunt path 24(1)A, the switchable shunt path 24(2)A, and the switchable shunt path SWA are closed simultaneously. Accordingly, the switch device 12A does not present approximately the filter capacitance of the filter circuit 32(1) to the RF port 20(3)A and does not present approximately the device capacitance provided by the off switch capacitance CO(1)A and the variable capacitance of the capacitive element 26(1)A to the RF port 20(3)A.

Furthermore, the switch device 12A does not present approximately the filter capacitance of the filter circuit 32(2) to the RF port 20(3)A and does not present approximately the device capacitance provided by the off switch capacitance CO(2)A and the variable capacitance of the capacitive element 26(2)A to the RF port 20(3)A. However, since the switchable shunt path SCA is closed and both the switchable series path 22(3)A and the switchable shunt path 24(3)A are open, the switch device 12A presents the device capacitance provided by the off switch capacitance CO(3)A and the variable capacitance of the capacitive element 26(3)A to the RF port 20(3)A.

Unlike the second carrier aggregation mode described above with respect to FIG. 3, the RF signal from the filter circuit 32(4) is not provided to the common port 18B. In FIG. 5, the control circuitry 16 has provided a permutation of the switch control output 42 to the switch device 12B where the permutation indicates that the switchable series path 22(1)B should be closed, the switchable shunt path 24(1)B should be open, the switchable series path 22(2)B should be opened, the switchable shunt path 24(2)B should be closed, the switchable series path 22(3)B should be opened, the switchable shunt path 24(3)B should be closed, and the switchable shunt path SCB should be open. The switch device 12B responds in accordance with the permutation of the switch control output 42 so that the switchable series path 22(1)B is closed, the switchable shunt path 24(1)B is open, the switchable series path 22(2)B is closed, the switchable shunt path 24(2)B is opened, the switchable series path 22(3)B is opened, the switchable shunt path 24(3)B is closed, and the switchable shunt path SCB is open.

More specifically, as shown in FIG. 5, the control circuitry 16 is configured to turn on the switch 28(1)B to close the switchable series path 22(1)B, to turn off the switch 30(1)B to open the switchable shunt path 24(1)B, to turn off the switch 28(2)B to open the switchable series path 22(2)B, to turn on the switch 30(2)B to close the switchable shunt path 24(2)B, to turn off the switch 28(3)B to open the switchable series path 22(3)B, to turn on the switch 30(3)B to close the switchable shunt path 24(3)B and to turn off the switch SWB to open the switchable shunt path SCB. Since the switchable shunt path SCB is open, the switch device 12B does present the approximate filter capacitance of the filter circuit 32(3) from the RF port 20(1)B to the common port 18B. Also, the switch device 12B does not present approximately the filter capacitance of the filter circuit 32(4) to the common port 18B but does presents the approximate device capacitance provided by the off switch capacitance CO(2)B and the variable capacitance of the capacitive element 26(2)B to the common port 18B.

Furthermore, the switch device 12B does not present approximately the filter capacitance of the filter circuit 32(5) to the common port 18B but does present the approximate device capacitance provided by the off switch capacitance CO(3)B and the variable capacitance of the capacitive element 26(3)B to the common port 18B since the switchable shunt path SCB is open. Also, the switch device 12B presents the approximate device capacitance from the RF port 20(3)A provided by the off switch capacitance CO(3)A and the variable capacitance of the capacitive element 26(3)A to the common port 18B. Finally, the switch device 12B does not present the device capacitance provided by the off switch capacitance CO(1)B or the variable capacitance of the capacitive element 26(1)B to the common port 18B. In this manner, the RF signal from the filter circuit 32(3) is transmitted simultaneously to the common port 18B.

Thus, the switch device 12B presents approximately the filter capacitance of the filter circuit 32(3) from the RF port 20(1)B, approximately the device capacitance from the RF port 20(3)A provided by the off switch capacitance CO(3)A, and the variable capacitance of the capacitive element 26(3)A to the common port 18B. In this manner, the device capacitance provided by the off switch capacitance CO(3)A and the variable capacitance of the capacitive element 26(3)A are utilized to tune the capacitance seen at the RF port 20(1)B of the switch device 12B without requiring an additional variable capacitive element to be directly connected at filter circuit 32(3) for tuning.

In FIG. 5, the control circuitry 16 provides a permutation of the tuning control output 46 to the switch device 12B that indicates either no change to the variable capacitance of the capacitive element 26(1)B or sets the variable capacitance to a default capacitance level (e.g., a minimum capacitance level) because the switchable series path 22(1)B is closed in the second non-carrier aggregation mode. Thus, the filter circuit 32(3) is not isolated from the common port 18B in the second non-carrier aggregation mode and the switch device 12B presents the filter capacitance of the filter circuit 32(3) from the RF port 20(1)B to the common port 18B.

With regard to the filter circuit 32(4), the permutation of the tuning control output 46 provided to the switch device 12B that either does not change the variable capacitance of the capacitive element 26(2)B or sets the variable capacitance to a default capacitance level (e.g., a minimum capacitance level) because the switchable series path 22(2)B is open in the second non-carrier aggregation mode. Thus, the filter circuit 32(4) is isolated from the common port 18B in the second non-carrier aggregation mode and the switch device 12B presents the device capacitance provided by the variable capacitance of the capacitive element 26(2)B and the off switch capacitance CO(2)B at the common port 18B.

With regard to the filter circuit 32(5), the filter circuit 32(5) is isolated from the common port 18B in the second non-carrier aggregation mode from the common port 18B. Thus, the permutation of the tuning control output 46 provided to the switch device 12B also indicates that the variable capacitance of the capacitive element 26(3)B sets the device capacitance presented by the off switch capacitance CO(3)B and the variable capacitance of the capacitive element 26(3)B approximately equal to the filter capacitance of the filter circuit 32(5).

In FIG. 5, the control circuitry 16 has also provided the permutation of the tuning control output 44 to the switch device 12A that indicates the variable capacitance of the capacitive element 26(3)A which sets the device capacitance presented by the off switch capacitance CO(3)A and the variable capacitance of the capacitive element 26(3)A approximately equal to the filter capacitance of the filter circuit 32(1). Thus, in the second non-carrier aggregation mode, approximately the device capacitance presented by the off switch capacitance CO(3)A and the variable capacitance of the capacitive element 26(3)A are provided at the common port 18B. Carrier aggregation with the filter circuit 32(1) also involves the filter circuit 32(1), as explained in further detail below. As such, although the filter circuit 32(1) is isolated from the common port 18B in the second non-carrier aggregation mode, the filter circuit 32(3) continues to see a consistent capacitance during operation since the device capacitance presented by the off switch capacitance CO(3)A and the variable capacitance of the capacitive element 26(3)A approximately equal to the filter capacitance of the filter circuit 32(1).

With regard to the filter circuit 32(1), the permutation of the tuning control output 44 provided to the switch device 12A indicates either no change to the variable capacitance of the capacitive element 26(1)A or sets the variable capacitance to a default capacitance level (e.g., a minimum capacitance level) because the switchable shunt path 24(1)A is closed and the switchable shunt path SCA is closed in the second non-carrier aggregation mode. Thus, the filter circuit 32(1) is isolated from the common port 18B in the second non-carrier aggregation mode. In this manner, the inductor RIB is presented approximately the same total capacitance as above with respect to FIG. 3 in the second carrier aggregation mode.

With regard to the filter circuit 32(2), the permutation of the tuning control output 44 provided to the switch device 12A indicates either no change to the variable capacitance of the capacitive element 26(2)A or sets the variable capacitance to a default capacitance level (e.g., a minimum capacitance level) because the switchable shunt path 24(2)A is closed and the switchable shunt path SCA is closed in the second non-carrier aggregation mode. Thus, the filter circuit 32(2) is isolated from the common port 18B in the second non-carrier aggregation mode.

Accordingly, in response to the tuning control output 44, the switch device 12A sets the variable capacitance of the capacitive element 26(3)A so that the device capacitance presented by the off switch capacitance CO(3)A and the variable capacitance of the capacitive element 26(3)A approximately equal the filter capacitance of the filter circuit 32(1). On the other hand, in response to the tuning control output 44, the switch device 12A does not change the variable capacitance of the capacitive element 26(1)A and the variable capacitance of the capacitive element 26(2)A but rather sets them both to a default capacitance level (e.g., minimum capacitance level).

Furthermore, in response to the tuning control output 46, the switch device 12B sets the variable capacitance of the capacitive element 26(3)B so that the device capacitance presented by the off switch capacitance CO(3)B and the variable capacitance of the capacitive element 26(3)B approximately equal the filter capacitance of the filter circuit 32(5). On the other hand, in response to the tuning control output 46, the switch device 12B does not change the variable capacitance of the capacitive element 26(2)B and the variable capacitance of the capacitive element 26(1)B but rather sets them both to a default capacitance level (e.g., minimum capacitance level). In this manner, the inductor RIB is presented approximately the same total capacitance as above with respect to FIG. 3 in the second carrier aggregation mode.

Figure 6:
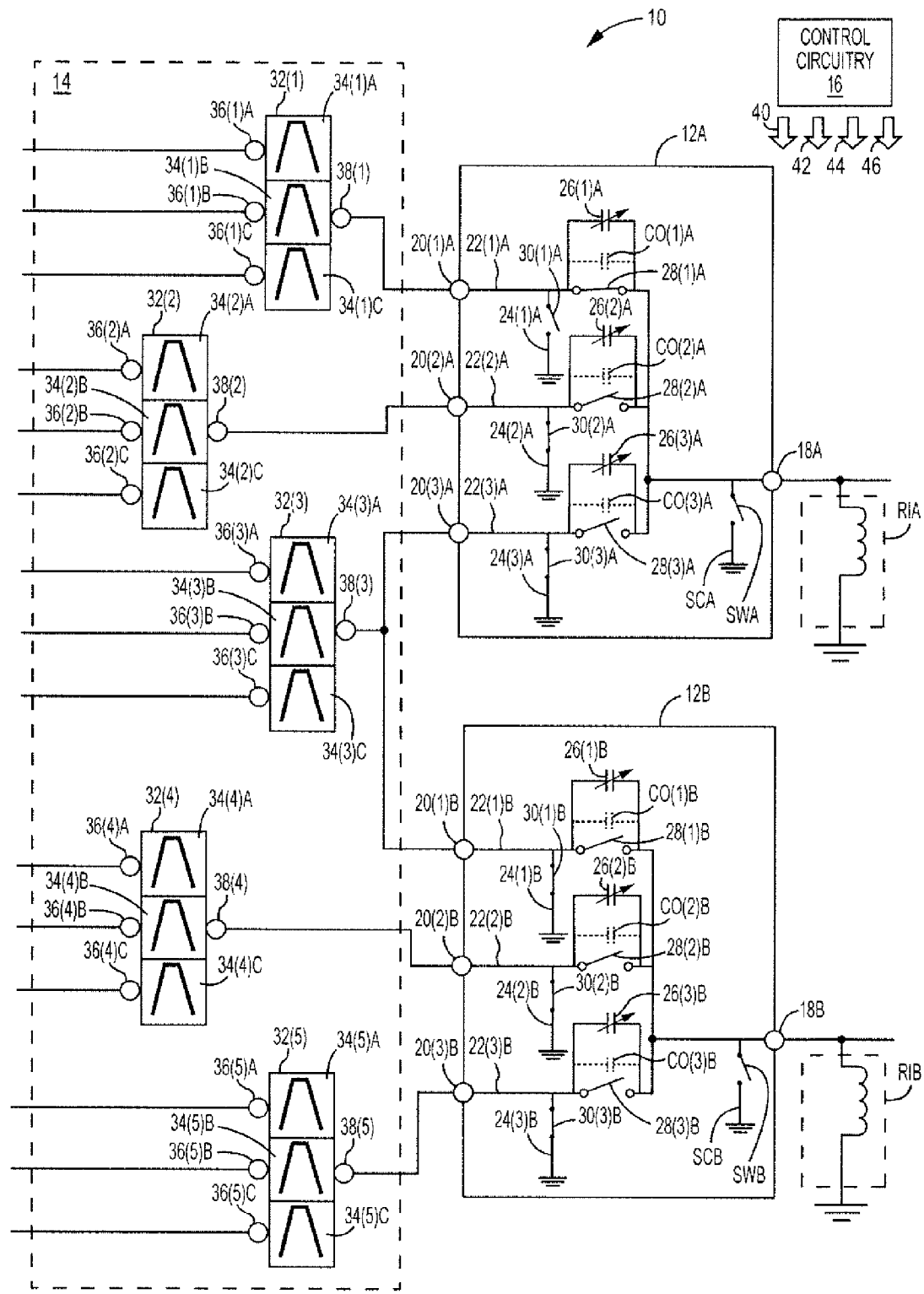
FIG. 6 illustrates the RF front end circuitry shown in FIG. 1 operating in a third non-carrier aggregation mode wherein a filter circuit connected only to the first switch device and utilized in the first carrier aggregation mode is providing an RF signal to the first common port.

FIG. 6 illustrates the RF front end circuitry 10 shown in FIG. 1 where the RF front end circuitry 10 is operating in a third non-carrier aggregation mode with the switch device 12A set to route the RF signal from the filter circuit 32(1), but unlike the first carrier aggregation mode described above in FIG. 2, not to route the other RF signal from the filter circuit 32(3) to the common port 18A. In FIG. 6, the control circuitry 16 has provided a permutation of the switch control output 40 to the switch device 12A where the permutation indicates that the switchable series path 22(1)A should be closed, the switchable shunt path 24(1)A should be open, the switchable series path 22(2)A should be opened, the switchable shunt path 24(2)A should be closed, the switchable series path 22(3)A should be opened, the switchable shunt path 24(3)A should be closed, and the switchable shunt path SCA should be open. The switch device 12A responds in accordance with the permutation of the switch control output 40 so that the switchable series path 22(1)A is closed, the switchable shunt path 24(1)A is opened, the switchable series path 22(2)A is opened, the switchable shunt path 24(2)A is closed, the switchable series path 22(3)A is opened, the switchable shunt path 24(3)A is closed, and the switchable shunt path SCA is opened.

More specifically, as shown in FIG. 6, the control circuitry 16 is configured to turn on the switch 28(1)A to close the switchable series path 22(1)A, to turn off the switch 30(1)A to open the switchable shunt path 24(1)A, to turn off the switch 28(2)A to open the switchable series path 22(2)A, to turn on the switch 30(2)A to close the switchable shunt path 24(2)A, to turn off the switch 28(3)A to open the switchable series path 22(3)A, to turn on the switch 30(3)A to close the switchable shunt path 24(3)A, and to turn off the switch SWA to open the switchable shunt path SCA. Since the switchable shunt path SCA is open, the switch device 12A presents approximately the filter capacitance of the filter circuit 32(1) to the common port 18A and does not present approximately the device capacitance provided by the off switch capacitance CO(1)A and the variable capacitance of the capacitive element 26(1)A to the common port 18A. Furthermore, the switch device 12A does not present approximately the filter capacitance of the filter circuit 32(2) to the common port 18A but does present the approximate device capacitance provided by the off switch capacitance CO(2)A and the variable capacitance of the capacitive element 26(2)A to the common port 18A since the switchable shunt path SCA is open. Also, the switch device 12A does not present approximately the filter capacitance of the filter circuit 32(3) from the RF port 20(3)A and does not present approximately the device capacitance from the RF port 20(1)B provided by the off switch capacitance CO(1)B and the variable capacitance of the capacitive element 26(1)B to the common port 18A. Finally, the switch device 12A does present the device capacitance provided by the off switch capacitance CO(3)A and the variable capacitance of the capacitive element 26(3)A to the common port 18A. In this manner, the RF signal from the filter circuit 32(1) is transmitted to the common port 18A. Previously, as described above with regard to FIG. 2, the filter circuit 32(1) was involved in carrier aggregation with the filter circuit 32(3) in the first carrier aggregation mode.

In FIG. 6, the control circuitry 16 has provided a permutation of the switch control output 42 to the switch device 12B that indicates that the switchable series path 22(1)B should be opened, the switchable shunt path 24(1)B should be closed, the switchable series path 22(2)B should be opened, the switchable shunt path 24(2)B should be closed, the switchable series path 22(3)B should be opened, the switchable shunt path 24(3)B should be closed, and the switchable shunt path SCB should be opened. The switch device 12B responds in accordance with the permutation of the switch control output 42 so that the switchable series path 22(1)B is opened, the switchable shunt path 24(1)B is closed, the switchable series path 22(2)B is opened, the switchable shunt path 24(2)B is closed, the switchable series path 22(3)B is opened, the switchable shunt path 24(3)B is closed, and the switchable shunt path SCB is opened.

More specifically, as shown in FIG. 6, the control circuitry 16 is configured to turn off the switch 28(1)B to open the switchable series path 22(1)B, to turn on the switch 30(1)B to close the switchable shunt path 24(1)B, to turn off the switch 28(2)B to open the switchable series path 22(2)B, to turn on the switch 30(2)B to close the switchable shunt path 24(2)B, to turn off the switch 28(3)B to open the switchable series path 22(3)B, to turn on the switch 30(3)B to close the switchable shunt path 24(3)B, and to turn off the switch SWB to open the switchable shunt path SCB. Since the switchable shunt path 24(1) is closed, the switch device 12B isolates the filter circuit 32(4), the switchable series path 22(2)B, the capacitive element 26(2)B, the filter circuit 32(5), the switchable series path 22(3)B, and the capacitive element 26(3)B from the RF port 20(1)B (and thus the switch device 12A including the common port 18A). The device capacitance presented by the off switch capacitance CO(1)B and the variable capacitance of the capacitive element 26(1)B, the device capacitance presented by the off switch capacitance CO(2)B and the variable capacitance of the capacitive element 26(2)B, and device capacitance presented by the off switch capacitance CO(3)B and the variable capacitance of the capacitive element 26(3)B are presented to the common port 18B since the switchable shunt path SCB is open.

In FIG. 6, the control circuitry 16 has provided a permutation of the tuning control output 44 to the switch device 12A with either no change to the variable capacitance of the capacitive element 26(1)A or it sets the variable capacitance to a default capacitance level (e.g., a minimum capacitance level) because the switchable series path 22(1)A is closed in the third non-carrier aggregation mode. Thus, the filter circuit 32(1) is not isolated from the common port 18A in the third non-carrier aggregation mode and the switch device 12A presents the filter capacitance of the filter circuit 32(1) from the RF port 20(1)A at the common port 18A.

With regard to the filter circuit 32(2), the filter circuit 32(2) is isolated from the common port 18A in the third non-carrier aggregation mode from the common port 18A. Thus, the permutation of the tuning control output 44 provided to the switch device 12A also indicates that the variable capacitance of the capacitive element 26(2)A sets the device capacitance presented by the off switch capacitance CO(2)A and the variable capacitance of the capacitive element 26(2)A approximately equal to the filter capacitance of the filter circuit 32(2).

With regard to the filter circuits 32(3), 32(4), 32(5), the filter circuit 32(3), 32(4), 32(5) are isolated from the common port 18A in the third non-carrier aggregation mode from the common port 18A. However, as described above with respect to FIGS. 2 and 4, the capacitance presented from the RF port 20(3)A is maintained to be approximately equal to the filter capacitance of the filter circuit 32(3) and the filter capacitance of the filter circuit 32(4). Thus, the permutation of the tuning control output 44 provided to the switch device 12A also indicates that the variable capacitance of the capacitive element 26(3)A sets the device capacitance presented by the off switch capacitance CO(3)A and the variable capacitance of the capacitive element 26(3)A approximately equal to the filter capacitance of the filter circuit 32(3) and the filter capacitance of the filter circuit 32(4). In this manner, the inductor RIA is presented approximately the same total capacitance as described above with respect to FIGS. 2 and 4.

In FIG. 6, the control circuitry 16 has also provided the permutation of the tuning control output 46 provided to the switch device 12B that indicates the variable capacitance of the capacitive element 26(1)B which sets the device capacitance presented by the off switch capacitance CO(1)B and the variable capacitance of the capacitive element 26(1)B approximately equal to the filter capacitance of the filter circuit 32(3) and the filter circuit 32(1). By closing the switchable shunt path 24(3)A, the switch device 12B is isolated from the capacitances of the switch device 12A.

In FIG. 6, the filter circuit 32(3) is isolated from the common port 18B in the third non-carrier aggregation mode and the switch device 12B presents the device capacitance provided by the variable capacitance of the capacitive element 26(1)B and the off switch capacitance CO(1)B at the common port 18B.

Also, the filter circuit 32(4) is isolated from the common port 18B in the third non-carrier aggregation mode, and the switch device 12B presents the device capacitance provided by the variable capacitance of the capacitive element 26(2)B and the off switch capacitance CO(2)B at the common port 18B. The tuning control output 46 provided to the switch device 12B indicates the variable capacitance of the capacitive element 26(2)B should be set so that the device capacitance presented by the off switch capacitance CO(2)B and the variable capacitance of the capacitive element 26(2)B are approximately equal to the filter capacitance of the filter circuit 32(4).

Finally, the filter circuit 32(5) is isolated from the common port 18B in the third non-carrier aggregation mode, and the switch device 12B presents the device capacitance provided by the variable capacitance of the capacitive element 26(3)B and the off switch capacitance CO(3)B at the common port 18B. The tuning control output 46 provided to the switch device 12B indicates the variable capacitance of the capacitive element 26(3)B should be set so that the device capacitance presented by the off switch capacitance CO(3)B and the variable capacitance of the capacitive element 26(3)B are approximately equal to the filter capacitance of the filter circuit 32(5). In this manner, the total capacitance presented to the inductor RIB is approximately the same as the capacitance presented to inductor RIB in FIG. 3 and FIG. 5.

Figure 7:
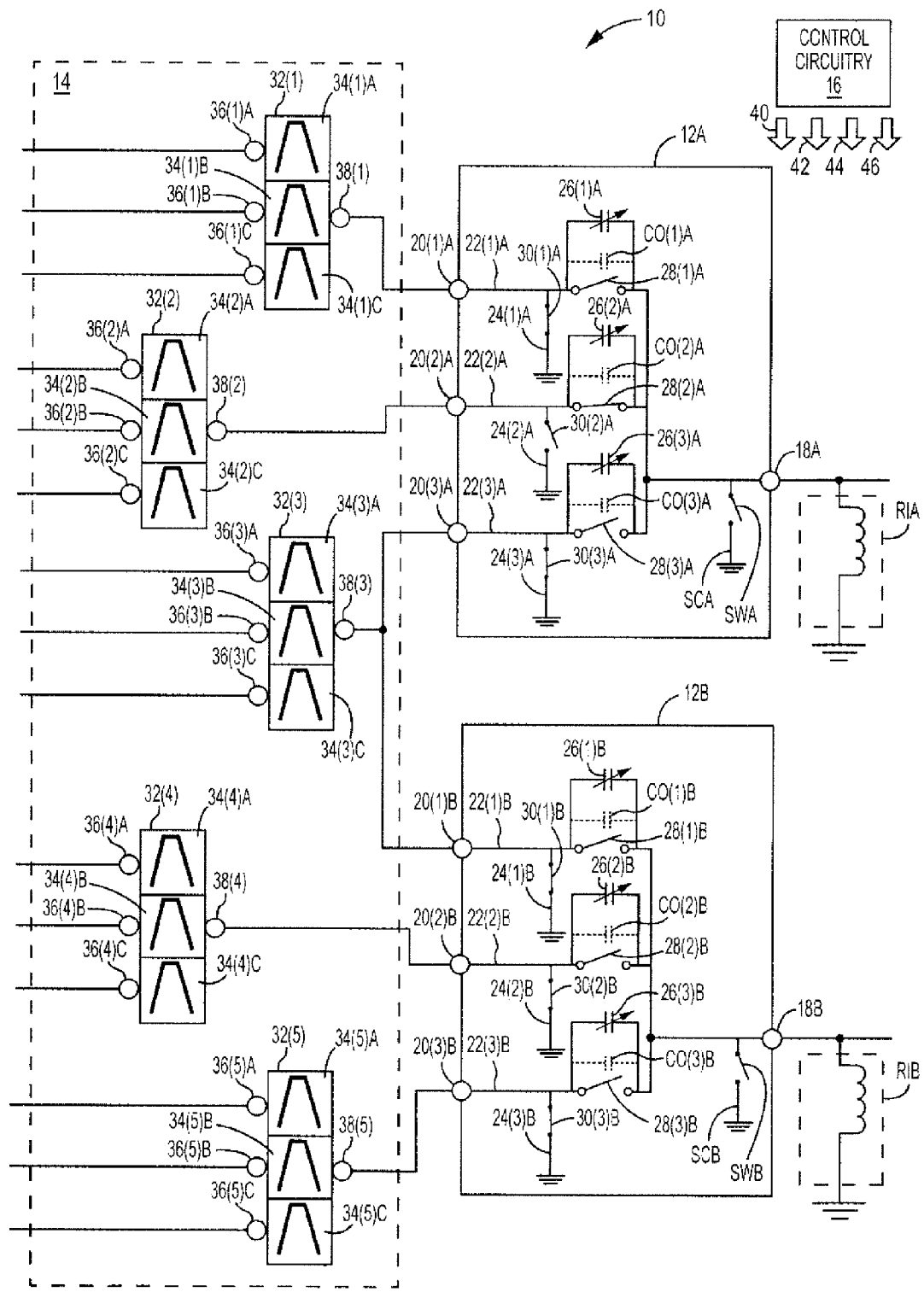
FIG. 7 illustrates the RF front end circuitry shown in FIG. 1 operating in a fourth non-carrier aggregation mode wherein a filter circuit connected only to the first switch device and not utilized in the first carrier aggregation mode is providing an RF signal to the first common port.

FIG. 7 illustrates the RF front end circuitry 10 shown in FIG. 1 where the RF front end circuitry 10 is operating in a fourth non-carrier aggregation mode with the switch device 12A set to route an RF signal from the filter circuit 32(2) to the common port 18A. Note that the RF signal from the filter circuit 32(2) is not involved in carrier aggregation with the RF signals from the filter circuits 32(1), 32(3), 32(4). In FIG. 7, the control circuitry 16 has provided a permutation of the switch control output 40 to the switch device 12A where the permutation indicates that the switchable series path 22(2)A should be closed, the switchable shunt path 24(2)A should be open, the switchable series path 22(1)A should be opened, the switchable shunt path 24(1)A should be closed, the switchable series path 22(3)A should be opened, the switchable shunt path 24(3)A should be closed, and the switchable shunt path SCA should be open. The switch device 12A responds in accordance with the permutation of the switch control output 40 so that the switchable series path 22(2)A is closed, the switchable shunt path 24(2)A is opened, the switchable series path 22(1)A is opened, the switchable shunt path 24(1)A is closed, the switchable series path 22(3)A is opened, the switchable shunt path 24(3)A is closed, and the switchable shunt path SCA is opened.

More specifically, as shown in FIG. 7, the control circuitry 16 is configured to turn on the switch 28(2)A to close the switchable series path 22(2)A, to turn off the switch 30(2)A to open the switchable shunt path 24(2)A, to turn off the switch 28(1)A to open the switchable series path 22(1)A, to turn on the switch 30(1)A to close the switchable shunt path 24(1)A, to turn off the switch 28(3)A to open the switchable series path 22(3)A, to turn on the switch 30(3)A to close the switchable shunt path 24(3)A, and to turn off the switch SWA to open the switchable shunt path SCA. Since the switchable shunt path SCA is open, the switch device 12A presents approximately the filter capacitance of the filter circuit 32(2) to the common port 18A and does not present approximately the device capacitance provided by the off switch capacitance CO(2)A and the variable capacitance of the capacitive element 26(2)A to the common port 18A. Furthermore, the switch device 12A does not present approximately the filter capacitance of the filter circuit 32(1) to the common port 18A but does present the approximate device capacitance provided by the off switch capacitance CO(1)A and the variable capacitance of the capacitive element 26(1)A to the common port 18A, since the switchable shunt path SCA is open. Also, the switch device 12A does not present approximately the filter capacitance of the filter circuit 32(3) from the RF port 20(3)A and does not present approximately the device capacitance from the RF port 20(1)B provided by the off switch capacitance CO(1)B and the variable capacitance of the capacitive element 26(1)B to the common port 18A. Finally, the switch device 12A does present the device capacitance provided by the off switch capacitance CO(3)A and the variable capacitance of the capacitive element 26(3)A to the common port 18A. In this manner, the RF signal from the filter circuit 32(2) is transmitted to the common port 18A.

In FIG. 7, the control circuitry 16 has provided a permutation of the switch control output 42 to the switch device 12B that indicates that the switchable series path 22(1)B should be opened, the switchable shunt path 24(1)B should be closed, the switchable series path 22(2)B should be opened, the switchable shunt path 24(2)B should be closed, the switchable series path 22(3)B should be opened, the switchable shunt path 24(3)B should be closed, and the switchable shunt path SCB should be opened. The switch device 12B responds in accordance with the permutation of the switch control output 42 so that the switchable series path 22(1)B is opened, the switchable shunt path 24(1)B is closed, the switchable series path 22(2)B is opened, the switchable shunt path 24(2)B is closed, the switchable series path 22(3)B is opened, the switchable shunt path 24(3)B is closed, and the switchable shunt path SCB is opened.

More specifically, as shown in FIG. 7, the control circuitry 16 is configured to turn off the switch 28(1)B to open the switchable series path 22(1)B, to turn on the switch 30(1)B to close the switchable shunt path 24(1)B, to turn off the switch 28(2)B to open the switchable series path 22(2)B, to turn on the switch 30(2)B to close the switchable shunt path 24(2)B, to turn off the switch 28(3)B to open the switchable series path 22(3)B, to turn on the switch 30(3)B to close the switchable shunt path 24(3)B, and to turn off the switch SWB to open the switchable shunt path SCB. Since the switchable shunt path 24(1) is closed, the switch device 12B isolates the filter circuit 32(4), the switchable series path 22(2)B, the capacitive element 26(2)B, the filter circuit 32(5), the switchable series path 22(3)B, and the capacitive element 26(3)B from the RF port 20(1)B (and thus the switch device 12A including the common port 18A). The device capacitance presented by the off switch capacitance CO(1)B and the variable capacitance of the capacitive element 26(1)B, the device capacitance presented by the off switch capacitance CO(2)B and the variable capacitance of the capacitive element 26(2)B, and device capacitance presented by the off switch capacitance CO(3)B and the variable capacitance of the capacitive element 26(3)B are presented to the common port 18B since the switchable shunt path SCB is open.

In FIG. 7, the control circuitry 16 has provided a permutation of the tuning control output 44 to the switch device 12A with either no change to the variable capacitance of the capacitive element 26(2)A or set the variable capacitance to a default capacitance level (e.g., a minimum capacitance level) because the switchable series path 22(2)A is closed in the fifth non-carrier aggregation mode. Thus, the filter circuit 32(2) is not isolated from the common port 18A in the fifth non-carrier aggregation mode and the switch device 12A presents the filter capacitance of the filter circuit 32(2) from the RF port 20(2)A is presented at the common port 18A.

With regard to the filter circuit 32(1), the filter circuit 32(1) is isolated from the common port 18A in the fifth non-carrier aggregation mode from the common port 18A. Thus, the permutation of the tuning control output 44 provided to the switch device 12A also indicates that the variable capacitance of the capacitive element 26(1)A sets the device capacitance presented by the off switch capacitance CO(1)A and the variable capacitance of the capacitive element 26(1)A approximately equal to the filter capacitance of the filter circuit 32(1).

With regard to the filter circuits 32(3), 32(4), 32(5), the filter circuit 32(3), 32(4), 32(5) are isolated from the common port 18A in the fourth non-carrier aggregation mode from the common port 18A. However, as described above with respect to FIGS. 3 and 5, the capacitance presented from the RF port 20(3)A is maintained to be approximately equal to the filter capacitance of the filter circuit 32(3) and the filter capacitance of the filter circuit 32(4). Thus, the permutation of the tuning control output 44 provided to the switch device 12A also indicates that the variable capacitance of the capacitive element 26(3)A which sets the device capacitance presented by the off switch capacitance CO(3)A and the variable capacitance of the capacitive element 26(3)A approximately equal to the filter capacitance of the filter circuit 32(3) and the filter capacitance of the filter circuit 32(4). In this manner, the inductor RIA is presented approximately the same total capacitance as above with respect to FIGS. 3, 5 and 6.

In FIG. 7, the control circuitry 16 has also provided the permutation of the tuning control output 46 to the switch device 12B that indicates the variable capacitance of the capacitive element 26(1)B which sets the device capacitance presented by the off switch capacitance CO(1)B and the variable capacitance of the capacitive element 26(1)B approximately equal to the filter capacitance of the filter circuit 32(3) and the filter circuit 32(2). This is because by closing the switchable shunt path 24(3)A, the switch device 12B is isolated from the capacitances of the switch device 12A.

In FIG. 7, the filter circuit 32(3) is isolated from the common port 18B in the fifth non-carrier aggregation mode, and the switch device 12B presents the device capacitance provided by the variable capacitance of the capacitive element 26(1)B and the off switch capacitance CO(1)B at the common port 18B.

Also, the filter circuit 32(4) is isolated from the common port 18B in the fifth non-carrier aggregation mode, and the switch device 12B presents the device capacitance provided by the variable capacitance of the capacitive element 26(2)B and the off switch capacitance CO(2)B at the common port 18B. The tuning control output 46 provided to the switch device 12B indicates the variable capacitance of the capacitive element 26(2)B should be set so that the device capacitance presented by the off switch capacitance CO(2)B and the variable capacitance of the capacitive element 26(2)B approximately equal to the filter capacitance of the filter circuit 32(4).

Finally, the filter circuit 32(5) is isolated from the common port 18B in the fifth non-carrier aggregation mode, and the switch device 12B presents the device capacitance provided by the variable capacitance of the capacitive element 26(3)B and the off switch capacitance CO(3)B at the common port 18B. The tuning control output 46 provided to the switch device 12B indicates the variable capacitance of the capacitive element 26(3)B should be set so that the device capacitance presented by the off switch capacitance CO(3)B and the variable capacitance of the capacitive element 26(3)B approximately equal the filter capacitance of the filter circuit 32(5). In this manner, the total capacitance presented to the inductor RIB is approximately the same as the capacitance presented to inductor RIB in FIGS. 3, 5, 6.

Figure 8:
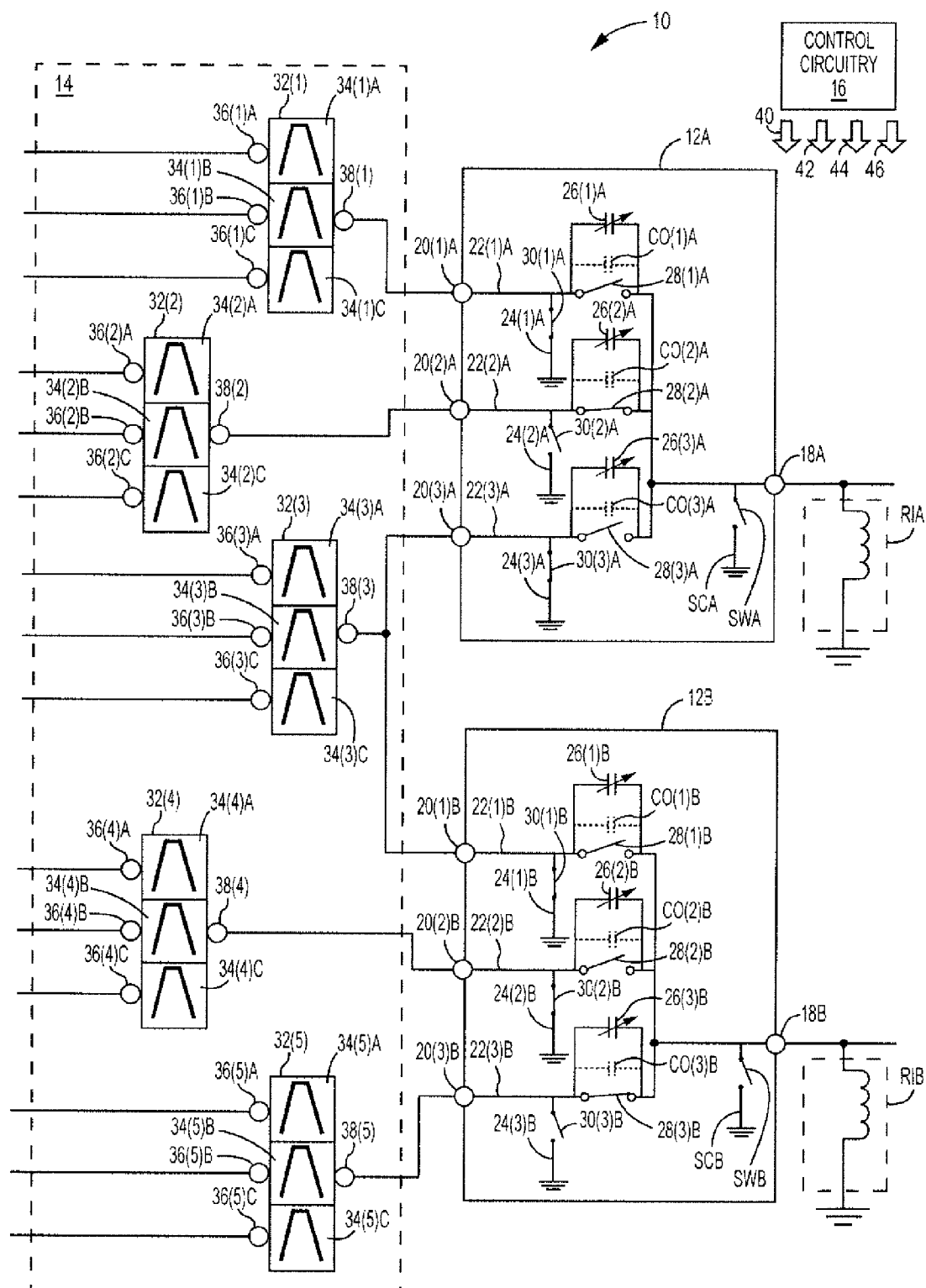
FIG. 8 illustrates the RF front end circuitry shown in FIG. 1 operating in a fifth non-carrier aggregation mode wherein a filter circuit connected only to the first switch device and not utilized in the first carrier aggregation mode is providing an RF signal to the first common port and a filter circuit connected only to the second switch device and not utilized in the second carrier aggregation mode is providing an RF signal to the second common node.

FIG. 8 illustrates the RF front end circuitry 10 shown in FIG. 1 where the RF front end circuitry 10 is operating in a fifth non-carrier aggregation mode with the switch device 12A set to route an RF signal from the filter circuit 32(2) to the common port 18A and set to route another RF signal from the filter circuit 32(5) to the common port 18B. Note that the RF signal from the filter circuit 32(2) and the RF signal from the filter circuit 32(5) are not involved in carrier aggregation with the RF signals from the filter circuit 32(1), 32(3), 32(4). In FIG. 8, the control circuitry 16 has provided a permutation of the switch control output 40 to the switch device 12A where the permutation indicates that the switchable series path 22(2)A should be closed, the switchable shunt path 24(2)A should be open, the switchable series path 22(1)A should be opened, the switchable shunt path 24(1)A should be closed, the switchable series path 22(3)A should be opened, the switchable shunt path 24(3)A should be closed, and the switchable shunt path SCA should be open. The switch device 12A responds in accordance with the permutation of the switch control output 40 so that the switchable series path 22(2)A is closed, the switchable shunt path 24(2)A is opened, the switchable series path 22(1)A is opened, the switchable shunt path 24(1)A is closed, the switchable series path 22(3)A is opened, the switchable shunt path 24(3)A is closed, and the switchable shunt path SCA is opened.

More specifically, as shown in FIG. 8, the control circuitry 16 is configured to turn on the switch 28(2)A to close the switchable series path 22(2)A, to turn off the switch 30(2)A to open the switchable shunt path 24(2)A, to turn off the switch 28(1)A to open the switchable series path 22(1)A, to turn on the switch 30(1)A to close the switchable shunt path 24(1)A, to turn off the switch 28(3)A to open the switchable series path 22(3)A, to turn on the switch 30(3)A to close the switchable shunt path 24(3)A, and to turn off the switch SWA to open the switchable shunt path SCA. Since the switchable shunt path SCA is open, the switch device 12A presents approximately the filter capacitance of the filter circuit 32(2) to the common port 18A and does not present approximately the device capacitance provided by the off switch capacitance CO(2)A and the variable capacitance of the capacitive element 26(2)A to the common port 18A. Furthermore, the switch device 12A does not present approximately the filter capacitance of the filter circuit 32(1) to the common port 18A but does present the approximate device capacitance provided by the off switch capacitance CO(1)A and the variable capacitance of the capacitive element 26(1)A to the common port 18A, since the switchable shunt path SCA is open. Also, the switch device 12A does not present approximately the filter capacitance of the filter circuit 32(3) from the RF port 20(3)A and does not present approximately the device capacitance from the RF port 20(1)B provided by the off switch capacitance CO(1)B and the variable capacitance of the capacitive element 26(1)B to the common port 18A. Finally, the switch device 12A does present the device capacitance provided by the off switch capacitance CO(3)A and the variable capacitance of the capacitive element 26(3)A to the common port 18A. In this manner, the RF signal from the filter circuit 32(2) is transmitted to the common port 18A.

In FIG. 8, the control circuitry 16 has provided a permutation of the switch control output 42 to the switch device 12B where the permutation indicates that the switchable series path 22(3)B should be closed, the switchable shunt path 24(3)B should be open, the switchable series path 22(2)B should be opened, the switchable shunt path 24(2)B should be closed, the switchable series path 22(1)B should be opened, the switchable shunt path 24(1)B should be closed, and the switchable shunt path SCB should be open. The switch device 12B responds in accordance with the permutation of the switch control output 42 so that the switchable series path 22(3)B is closed, the switchable shunt path 24(3)B is opened, the switchable series path 22(2)B is opened, the switchable shunt path 24(2)B is closed, the switchable series path 22(1)B is opened, the switchable shunt path 24(1)B is closed, and the switchable shunt path SCB is opened.

More specifically, as shown in FIG. 8, the control circuitry 16 is configured to turn on the switch 28(3)B to close the switchable series path 22(3)B, to turn off the switch 30(3)B to open the switchable shunt path 24(3)B, to turn off the switch 28(2)B to open the switchable series path 22(2)B, to turn on the switch 30(2)B to close the switchable shunt path 24(2)B, to turn off the switch 28(1)B to open the switchable series path 22(1)B, to turn on the switch 30(1)B to close the switchable shunt path 24(1)B, and to turn off the switch SWB to open the switchable shunt path SCB. Since the switchable shunt path SCB is open, the switch device 12B presents approximately the filter capacitance of the filter circuit 32(5) to the common port 18B and does not present approximately the device capacitance provided by the off switch capacitance CO(3)B and the variable capacitance of the capacitive element 26(3)B to the common port 18B. Furthermore, the switch device 12B does not present approximately the filter capacitance of the filter circuit 32(4) to the common port 18B but does present the approximate device capacitance provided by the off switch capacitance CO(2)B and the variable capacitance of the capacitive element 26(2)B to the common port 18B since the switchable shunt path SCB is open. Also, the switch device 12B does not present approximately the filter capacitance of the filter circuit 32(3) from the RF port 20(1)B and does not present approximately the device capacitance from the RF port 20(1)A provided by the off switch capacitance CO(1)A and the variable capacitance of the capacitive element 26(1)A to the common port 18B. Finally, the switch device 12B does present the device capacitance provided by the off switch capacitance CO(1)B and the variable capacitance of the capacitive element 26(1)B to the common port 18B. In this manner, the RF signal from the filter circuit 32(5) is transmitted to the common port 18B. Also, in this manner, the inductor RIB is presented approximately the same total capacitance as above with respect to FIGS. 3, 5, 6 and 7.

In FIG. 8, the control circuitry 16 has provided a permutation of the tuning control output 44 to the switch device 12A with either no change to the variable capacitance of the capacitive element 26(2)A, or it sets the variable capacitance to a default capacitance level (e.g., a minimum capacitance level) because the switchable series path 22(2)A is closed in the fifth non-carrier aggregation mode. Thus, the filter circuit 32(2) is not isolated from the common port 18A in the fifth non-carrier aggregation mode and the switch device 12A presents the filter capacitance of the filter circuit 32(2) from the RF port 20(2)A is presented at the common port 18A.

With regard to the filter circuit 32(1), the filter circuit 32(1) is isolated from the common port 18A in the fifth non-carrier aggregation mode from the common port 18A. Thus, the permutation of the tuning control output 44 provided to the switch device 12A also indicates that the variable capacitance of the capacitive element 26(1)A which sets the device capacitance presented by the off switch capacitance CO(1)A and the variable capacitance of the capacitive element 26(1)A approximately equal the filter capacitance of the filter circuit 32(1

With regard to the filter circuits 32(3), 32(4), 32(5), the filter circuit 32(3), 32(4), 32(5) are isolated from the common port 18A in the fifth non-carrier aggregation mode from the common port 18A. However, as described above with respect to FIGS. 2 and 4, the capacitance presented from the RF port 20(3)A is maintained to be approximately equal to the filter capacitance of the filter circuit 32(3) and the filter capacitance of the filter circuit 32(4). Thus, the permutation of the tuning control output 44 provided to the switch device 12A also indicates that the variable capacitance of the capacitive element 26(3)A which sets the device capacitance presented by the off switch capacitance CO(3)A and the variable capacitance of the capacitive element 26(3)A approximately equal to the filter capacitance of the filter circuit 32(3) and the filter capacitance of the filter circuit 32(4). In this manner, the inductor RIA is presented approximately the same total capacitance as above with respect to FIGS. 2, 4, 6, and 7.

In FIG. 8, the control circuitry 16 has provided a permutation of the tuning control output 46 to the switch device 12B either with no change to the variable capacitance of the capacitive element 26(3)B, or it sets the variable capacitance to a default capacitance level (e.g., a minimum capacitance level) because the switchable series path 22(3)B is closed in the fifth non-carrier aggregation mode. Thus, the filter circuit 32(5) is not isolated from the common port 18B in the fifth non-carrier aggregation mode, and the switch device 12B presents the filter capacitance of the filter circuit 32(5) from the RF port 20(3)B is presented at the common port 18B.

With regard to the filter circuit 32(4), the filter circuit 32(4) is isolated from the common port 18B in the fifth non-carrier aggregation mode from the common port 18B. Thus, the permutation of the tuning control output 46 provided to the switch device 12B also indicates that the variable capacitance of the capacitive element 26(2)B which sets the device capacitance presented by the off switch capacitance CO(2)B and the variable capacitance of the capacitive element 26(2)B approximately equal to the filter capacitance of the filter circuit 32(4).

With regard to the filter circuits 32(1), 32(2), 32(3), the filter circuit 32(1), 32(2), 32(3) are isolated from the common port 18B in the fifth non-carrier aggregation mode from the common port 18B. However, as described above with respect to FIGS. 3 and 5, the capacitance presented from the RF port 20(1)B is maintained to be approximately equal to the filter capacitance of the filter circuit 32(3) and the filter capacitance of the filter circuit 32(1). Thus, the permutation of the tuning control output 46 provided to the switch device 12B also indicates that the variable capacitance of the capacitive element 26(1)B which sets the device capacitance presented by the off switch capacitance CO(1)B and the variable capacitance of the capacitive element 26(1)B approximately equal to the filter capacitance of the filter circuit 32(3) and the filter capacitance of the filter circuit 32(1). In this manner, the inductor RIB is presented approximately the same total capacitance as above with respect to FIGS. 3, 5, 6, and 7.

Figure 9:
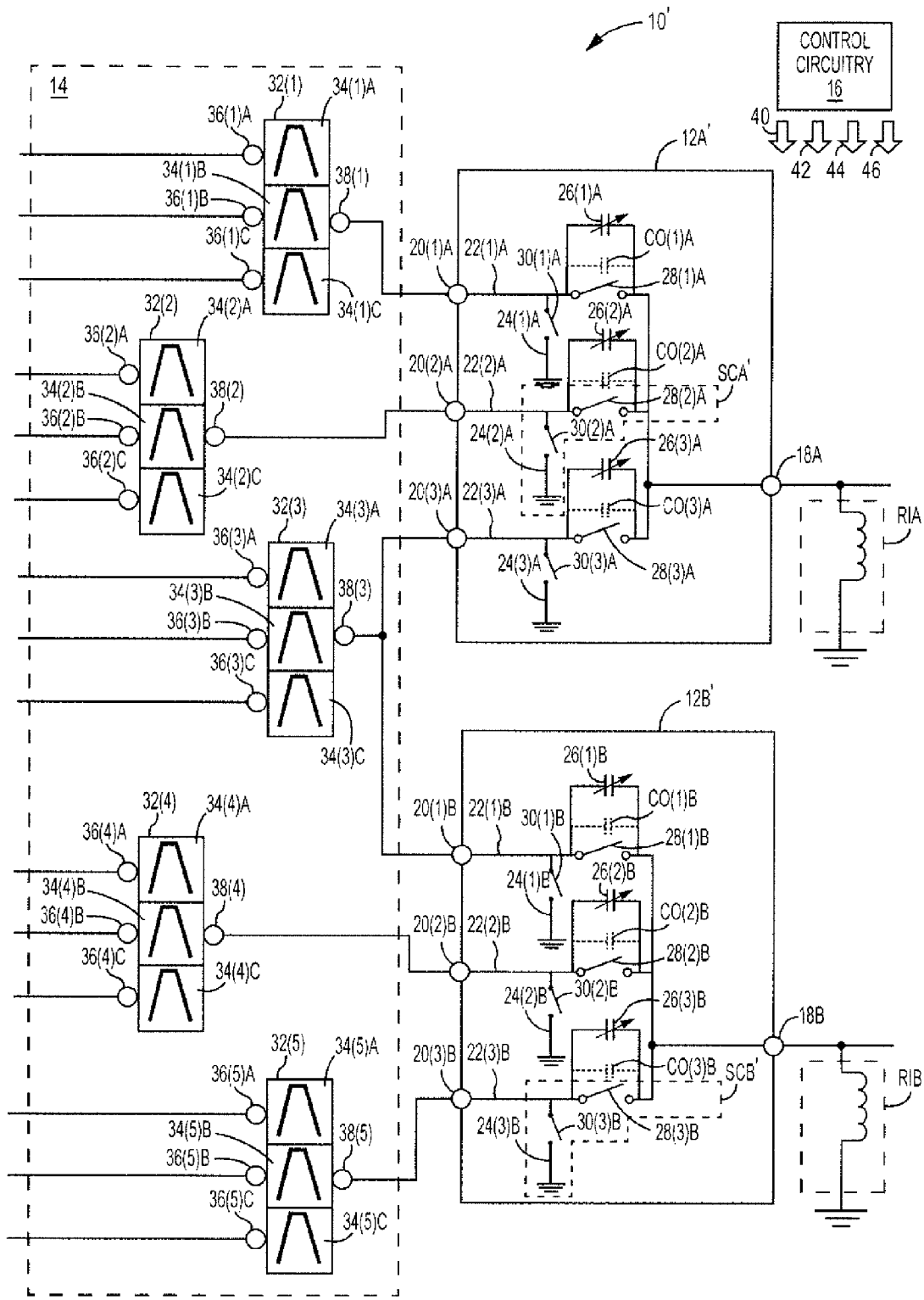
FIG. 9 illustrates another embodiment of RF front end circuitry that includes filtering circuitry, a first switch device, and a second switch device, wherein a first switchable shunt path that shunts the first common port of the first switch device is provided by at least a portion of a switchable series path and a switchable shunt path connected to another RF port of the first switch device and a second switchable shunt path that shunts the second common port of the second switch device is provided by at least a portion of another switchable series path and another switchable shunt path connected to another RF port of the second switch device.

FIG. 9 illustrates another embodiment of a RF front end circuitry 10'. The RF front end circuitry 10' includes another embodiment of a switch device 12A', and other embodiment of a switch device 12B', and the same embodiment of the filtering circuitry 14 described above with respect to FIG. 1. The switch device 12A' shown in FIG. 9 is the same as the switch device 12A shown in FIG. 1, except that the switchable shunt path SCA and the switchable shunt path SCB are not provided. Instead of the switchable shunt path SCA shown in FIG. 1, the switch device 12A' shown in FIG. 7 has a switchable shunt path SCA', which is made up of at least a portion of the switchable series path 22(2)A that includes the switch 28(2)A and the switchable shunt path 24(2)A. Thus, when both the switchable series path 22(2)A and the switchable shunt path 24(2)A are closed, the switchable shunt path SCA' is closed, and the common port 18A is shunted to ground. If either one or both the switchable series path 22(2)A and the switchable shunt path 24(2)A are opened, the switchable shunt path SCA' is opened. The switchable series path 22(2)A and the switchable shunt path 24(2)A are selected because the filter circuit 32(2) is not involved in carrier aggregation with any of the filter circuit 32(1), the filter circuit 32(3), and the filter circuit 32(4).

Also, rather than the switchable shunt path SCB shown in FIG. 1, the switch device 12A' shown in FIG. 9 has a switchable shunt path SCB', which is made up of at least a portion of the switchable series path 22(3)B that includes the switch 28(3)B and the switchable shunt path 24(3)B. Thus, when both the switchable series path 22(3)B and the switchable shunt path 24(3)B are closed, the switchable shunt path SCB' is closed and the common port 18B is shunted to ground. If either one or both the switchable series path 22(3)B or the switchable shunt path 24(3)B are opened, the switchable shunt path SCB' is opened. The switchable series path 22(3)B and the switchable shunt path 24(3)B are selected because the filter circuit 32(5) is not involved in carrier aggregation with any of the filter circuit 32(1), the filter circuit 32(3), and the filter circuit 32(4).

The RF front end circuitry 10' shown in FIG. 9 can be operated in the same operational modes as the RF front end circuitry 10 described above with regards to FIGS. 2-8. Obviously, the operation of the switchable shunt path SCA and the switchable shunt path SCB is not applicable to the RF front end circuitry 10 since these are not provided with the RF front end circuitry 10' shown in FIG. 9.

With regard to the first carrier aggregation mode described above with respect to FIG. 2, the switchable series path 22(1)A, the switchable shunt path 24(1)A, the switchable series path 22(2)A, the switchable shunt path 24(2)A, the switchable series path 22(3)A, the switchable shunt path 24(3)A, the switchable series path 22(1)B, the switchable shunt path 24(1)B, the switchable series path 22(2)B, and the switchable shunt path 24(2)B of the RF front end circuitry 10' shown in FIG. 9 are operated in the same manner described above with respect to FIG. 2. However, when the RF front end circuitry 10' shown in FIG. 9 is in the first carrier aggregation mode, the switchable series path 22(3)B, and the switchable shunt path 24(3)B are both closed so that the common port 18B is shunted to ground.

With regard to the second carrier aggregation mode described above with respect to FIG. 3, the switchable series path 22(1)A, the switchable shunt path 24(1)A, the switchable series path 22(3)A, the switchable shunt path 24(3)A, the switchable series path 22(1)B, the switchable shunt path 24(1)B, the switchable series path 22(2)B, the switchable shunt path 24(2)B, the switchable series path 22(3)B, and the switchable shunt path 24(3)B of the RF front end circuitry 10' shown in FIG. 9 are operated in the same manner described above with respect to FIG. 3. However, when the RF front end circuitry 10' shown in FIG. 9 is in the second carrier aggregation mode, the switchable series path 22(2)A, the switchable shunt path 24(2)A are both closed so that the common port 18A is shunted to ground.

With regard to the first non-carrier aggregation mode described above with respect to FIG. 4, the switchable series path 22(1)A, the switchable shunt path 24(1)A, the switchable series path 22(2)A, the switchable shunt path 24(2)A, the switchable series path 22(3)A, the switchable shunt path 24(3)A, the switchable series path 22(1)B, the switchable shunt path 24(1)B, the switchable series path 22(2)B, and the switchable shunt path 24(2)B of the RF front end circuitry 10' shown in FIG. 9 are operated in the same manner described above with respect to FIG. 4. However, when the RF front end circuitry 10' shown in FIG. 9 is in the first non-carrier aggregation mode, the switchable series path 22(3)B, and the switchable shunt path 24(3)B are both closed so that the common port 18B is shunted to ground.

With regard to the second non-carrier aggregation mode described above with respect to FIG. 5, the switchable series path 22(1)A, the switchable shunt path 24(1)A, the switchable series path 22(3)A, the switchable shunt path 24(3)A, the switchable series path 22(1)B, the switchable shunt path 24(1)B, the switchable series path 22(2)B, the switchable shunt path 24(2)B, the switchable series path 22(3)B, and the switchable shunt path 24(3)B of the RF front end circuitry 10' shown in FIG. 9 are operated in the same manner described above with respect to FIG. 5. However, when the RF front end circuitry 10' shown in FIG. 9 is in the second non-carrier aggregation mode, the switchable series path 22(2)A and the switchable shunt path 24(2)A are both closed so that the common port 18A is shunted to ground.

With regard to the third non-carrier aggregation mode described above with respect to FIG. 6, the switchable series path 22(1)A, the switchable shunt path 24(1)A, the switchable series path 22(2)A, the switchable shunt path 24(2)A, the switchable series path 22(3)A, the switchable shunt path 24(3)A, the switchable series path 22(1)B, the switchable shunt path 24(1)B, the switchable series path 22(2)B, the switchable shunt path 24(2)B, the switchable series path 22(3)B, and the switchable shunt path 24(3)B of the RF front end circuitry 10' shown in FIG. 9 are operated in the same manner described above with respect to FIG. 6.

With regard to the fourth non-carrier aggregation mode described above with respect to FIG. 7, the switchable series path 22(1)A, the switchable shunt path 24(1)A, the switchable series path 22(2)A, the switchable shunt path 24(2)A, the switchable series path 22(3)A, the switchable shunt path 24(3)A, the switchable series path 22(1)B, the switchable shunt path 24(1)B, the switchable series path 22(2)B, the switchable shunt path 24(2)B, the switchable series path 22(3)B, and the switchable shunt path 24(3)B of the RF front end circuitry 10' shown in FIG. 9 are operated in the same manner described above with respect to FIG. 7.

With regard to the fifth non-carrier aggregation mode described above with respect to FIG. 8, the switchable series path 22(1)A, the switchable shunt path 24(1)A, the switchable series path 22(2)A, the switchable shunt path 24(2)A, the switchable series path 22(3)A, the switchable shunt path 24(3)A, the switchable series path 22(1)B, the switchable shunt path 24(1)B, the switchable series path 22(2)B, the switchable shunt path 24(2)B, the switchable series path 22(3)B, and the switchable shunt path 24(3)B of the RF front end circuitry 10' shown in FIG. 9 are operated in the same manner described above with respect to FIG. 8.

Those skilled in the art will recognize improvements and modifications to the embodiments of the present disclosure. All such improvements and modifications are considered within the scope of the concepts disclosed herein and the claims that follow.

What is claimed is:

1. Radio frequency (RF) front end circuitry comprising:
   a first filter circuit having a first filter capacitance wherein the first filter circuit is coupled to present the first filter capacitance to a first RF port and to a second RF port, wherein the first RF port and the second RF port are coupled to one another;
   a first switch device comprising a first common port, the first RF port, a first switchable series path connected in series between the first common port and the first RF port, and a first switchable shunt path connected in shunt with respect to the first common port wherein the first switch device is configured to present approximately the first filter capacitance and a first device capacitance from the first RF port to the first common port when the first switchable series path is closed and the first switchable shunt path is opened; and a second switch device comprising a second common port, the second RF port, a second switchable series path connected in series between the second common port, and a second switchable shunt path connected in shunt with respect to the second common port wherein the second switch device is configured to present the first device capacitance to the second RF port when the second switchable series path is opened and the second switchable shunt path is closed.

2. The RF front end circuitry of claim 1 wherein the first switch device is further configured to present a second device capacitance to the first RF port when the first switchable series path is opened and the first switchable shunt path is closed.

3. The RF front end circuitry of claim 1 wherein the second switch device is configured to present approximately the first filter capacitance from the second RF port and approximately a second device capacitance from the second RF port to the second common port when the second switchable series path is closed and the second switchable shunt path is opened.

4. The RF front end circuitry of claim 1 wherein:
the first switch device is further configured to present a second device capacitance to the first RF port when the first switchable series path is opened and the first switchable shunt path is closed; and
the second switch device is configured to present approximately the first filter capacitance and the second device capacitance from the second RF port to the second common port when the second switchable series path is closed and the second switchable shunt path is opened.

5. The RF front end circuitry of claim 4 further comprising a third switchable shunt path coupled in shunt with respect to the first RF port wherein the first switch device is configured to present approximately a third device capacitance to the first common port and not present approximately the first filter capacitance and the first device capacitance to the first common port when the first switchable series path is open, the first switchable shunt path is open, and the third switchable shunt path is closed.

6. The RF front end circuitry of claim 4 further comprising a third switchable shunt path coupled in shunt with respect to the second RF port wherein the second switch device is configured to present approximately a third device capacitance to the second common port and not present approximately the first filter capacitance and the second device capacitance to the first common port when the first switchable series path is open, the first switchable shunt path is open, and the third switchable shunt path is closed.

7. The RF front end circuitry of claim 1 further comprising a second filter circuit coupled to a third RF port wherein:
the second filter circuit is configured to present a second filter capacitance at the third RF port; and
the second switch device further comprises the third RF port and a third switchable series path connected in series between the second common port and the third RF port wherein the second switch device is configured to present approximately the second filter capacitance of the second filter circuit to the second common port when the second switchable shunt path is open and the third switchable series path is closed.

8. The RF front end circuitry of claim 7 further comprising a control circuitry configured to set the first device capacitance approximately equal to the second filter capacitance when the second switchable series path is opened and the second switchable shunt path is closed.

9. The RF front end circuitry of claim 7 further comprising a third filter circuit coupled to a fourth RF port wherein:
the third filter circuit is configured to present a third filter capacitance at the fourth RF port; and
the first switch device further comprises the fourth RF port and a fourth switchable series path connected in series between the first common port and the fourth RF port wherein the first switch device is configured to:
present a second device capacitance to the first RF port when the first switchable series path is opened and the first switchable shunt path is closed; and
present approximately the third filter capacitance of the third filter circuit to the first common port when the fourth switchable series path is closed and the first switchable shunt path is opened.

10. The RF front end circuitry of claim 9 further comprising a control circuitry configured to:
set the first device capacitance approximately equal to the second filter capacitance when the second switchable series path is opened and the second switchable shunt path is closed; and
set the second device capacitance approximately equal to the third filter capacitance when the first switchable series path is opened and the first switchable shunt path is closed.

11. The RF front end circuitry of claim 9 further comprising a control circuitry, wherein the control circuitry is operable in a first carrier aggregation mode, wherein in the first carrier aggregation mode, the control circuitry is configured to:
open the first switchable shunt path;
close the second switchable shunt path;
close the first switchable series path;
open the second switchable series path;
open the third switchable series path; and
close the fourth switchable series path.

12. The RF front end circuitry of claim 11 wherein the control circuitry is further configured in the first carrier aggregation mode to set the first device capacitance approximately equal to the second filter capacitance.

13. The RF front end circuitry of claim 12 wherein the control circuitry is operable in a second carrier aggregation mode, wherein in the second carrier aggregation mode, the control circuitry is configured to:
close the first switchable shunt path;
open the second switchable shunt path;
open the first switchable series path;
close the second switchable series path;
close the third switchable series path; and
open the fourth switchable series path.

14. The RF front end circuitry of claim 13 wherein the control circuitry is further configured in the second carrier aggregation mode to set the second device capacitance approximately equal to the third filter capacitance.

15. The RF front end circuitry of claim 14 wherein:
the first switch device is further configured to present a third device capacitance to the first common port when the fourth switchable series path is open and the first switchable shunt path is open; and the second switch device is further configured to present a fourth device capacitance to the second common port when the third switchable series path is open and the second switchable shunt path is open.

16. The RF front end circuitry of claim 15 wherein the control circuitry is operably in a first non-carrier aggregation mode, wherein in the first non-carrier aggregation mode, the control circuitry is configured to:
open the first switchable shunt path;
close the second switchable shunt path;
close the first switchable series path;
open the second switchable series path;
open the third switchable series path; and
open the fourth switchable series path.

17. The RF front end circuitry of claim 16 wherein the control circuitry is operably in a second non-carrier aggregation mode, wherein in the second non-carrier aggregation mode, the control circuitry is configured to:
close the first switchable shunt path;
open the second switchable shunt path;
open the first switchable series path;
close the second switchable series path;
open the third switchable series path; and
open the fourth switchable series path.

18. The RF front end circuitry of claim 16 wherein the control circuitry is further configured to:
in the first non-carrier aggregation mode, set the first device capacitance approximately equal to the second filter capacitance;
in the first non-carrier aggregation mode, set the third device capacitance approximately equal to the third filter capacitance;
in the second non-carrier aggregation mode, set the second device capacitance approximately equal to the third filter capacitance; and
in the second non-carrier aggregation mode, set the fourth device capacitance approximately equal to the second filter capacitance.

19. The RF front end circuitry of claim 1 wherein:
the first switchable shunt path is directly connected from the first common port to ground; and
the second switchable shunt path is directly connected from the second common port to ground.

20. The RF front end circuitry of claim 1 wherein:
the first switchable shunt path comprises at least a portion of a third switchable series path and a third switchable shunt path, wherein the third switchable series path is connected between the first common port and a third RF port and the third switchable shunt path is connected so as to shunt the third RF port to ground; and
the second switchable shunt path comprises at least a portion of a fourth switchable series path and a fourth switchable shunt path, wherein the fourth switchable series path is connected between the second common port and a fourth RF port and the fourth switchable shunt path is connected so as to shunt the fourth RF port to ground.

21. The RF front end circuitry of claim 1 further comprising a second filter circuit, a third filter circuit, a fourth filter circuit, and a fifth filter circuit wherein:
the second filter circuit has a second filter capacitance wherein the second filter circuit is coupled to present the second filter capacitance to a third RF port;
the third filter circuit has a third filter capacitance wherein the third filter circuit is coupled to present the third filter capacitance to a fourth RF port;
the fourth filter circuit has a fourth filter capacitance wherein the fourth filter circuit is coupled to present the fourth filter capacitance to a fifth RF port;
the fifth filter circuit has a fifth filter capacitance wherein the fifth filter circuit is coupled to present the fifth filter capacitance to a sixth RF port;
the first switch device further comprises the third RF port, the fourth RF port, a third switchable series path connected in series between the first common port and the third RF port, a fourth switchable series path connected in series between the first common port and the fourth RF port; and
the second switch device further comprises the fifth RF port, the sixth RF port, a fifth switchable series path connected in series between the second common port and the fifth RF port, and a sixth switchable series path connected in series between the second common port and the sixth RF port.

22. The RF front end circuitry of claim 21 wherein:
the first switch device is further configured to:
present a second device capacitance to the first RF port when the first switchable series path is opened and the first switchable shunt path is closed;
present a third device capacitance to the first common port when the third switchable series path is opened and the first switchable shunt path is opened;
present the second filter capacitance to the first common port when the third switchable series path is closed and the first switchable shunt path is opened;
present a fourth device capacitance to the first common port when the fourth switchable series path is opened and the first switchable shunt path is opened; and
present the third filter capacitance to the first common port when the fourth switchable series path is closed and the fourth switchable shunt path is opened; and
the second switch device is further configured to:
present approximately the first filter capacitance and the second device capacitance from the second RF port to the second common port when the second switchable series path is closed and the second switchable shunt path is opened;
present a fifth device capacitance to the second common port when the fifth switchable series path is opened and the second switchable shunt path is opened;
present the fourth filter capacitance to the second common port when the fifth switchable series path is closed and the second switchable shunt path is opened;
present a sixth device capacitance to the second common port when the sixth switchable series path is opened and the second switchable shunt path is opened; and
present the fifth filter capacitance to the second common port when the sixth switchable series path is closed and the second switchable shunt path is opened.

23. The RF front end circuitry of claim 22 further comprising a control circuit operable in a non-carrier aggregation mode, wherein, in the non-carrier aggregation mode, the control circuit is configured to:
open the first switchable shunt path;
open the second switchable shunt path;
open the first switchable series path;
open the second switchable series path;
close the third switchable series path;
open the fourth switchable series path;

open the fifth switchable series path; and
open the sixth switchable series path.

24. The RF front end circuitry of claim 22 further comprising a control circuit operable in a non-carrier aggregation mode, wherein, in the non-carrier aggregation mode, the control circuit is configured to:
- open the first switchable shunt path;
- open the second switchable shunt path;
- open the first switchable series path;
- open the second switchable series path;
- open the third switchable series path;
- close the fourth switchable series path;
- open the fifth switchable series path; and
- open the sixth switchable series path.

25. The RF front end circuitry of claim 22 further comprising a control circuit operable in a non-carrier aggregation mode, wherein, in the non-carrier aggregation mode, the control circuit is configured to:
- open the first switchable shunt path;
- open the second switchable shunt path;
- open the first switchable series path;
- open the second switchable series path;
- open the third switchable series path;
- close the fourth switchable series path;
- open the fifth switchable series path; and
- close the sixth switchable series path.

* * * * *